United States Patent
Sugiura et al.

(10) Patent No.: US 10,840,944 B2
(45) Date of Patent: Nov. 17, 2020

(54) ENCODING APPARATUS, DECODING APPARATUS, DATA STRUCTURE OF CODE STRING, ENCODING METHOD, DECODING METHOD, ENCODING PROGRAM AND DECODING PROGRAM

(71) Applicant: NIPPON TELEGRAPH AND TELEPHONE CORPORATION, Chiyoda-ku (JP)

(72) Inventors: Ryosuke Sugiura, Atsugi (JP); Yutaka Kamamoto, Atsugi (JP); Takehiro Moriya, Atsugi (JP); Noboru Harada, Atsugi (JP)

(73) Assignee: NIPPON TELEGRAPH AND TELEPHONE CORPORATION, Chiyoda-ku (JP)

( * ) Notice: Subject to any disclaimer, the term of this patent is extended or adjusted under 35 U.S.C. 154(b) by 0 days.

(21) Appl. No.: 16/618,567

(22) PCT Filed: Apr. 20, 2018

(86) PCT No.: PCT/JP2018/016227
§ 371 (c)(1),
(2) Date: Dec. 2, 2019

(87) PCT Pub. No.: WO2019/021552
PCT Pub. Date: Jan. 31, 2019

(65) Prior Publication Data
US 2020/0162102 A1   May 21, 2020

(30) Foreign Application Priority Data
Jul. 25, 2017   (JP) .................. 2017-143403

(51) Int. Cl.
*H03M 7/40* (2006.01)
*G10L 19/032* (2013.01)

(52) U.S. Cl.
CPC ............. *H03M 7/40* (2013.01); *G10L 19/032* (2013.01)

(58) Field of Classification Search
CPC ............ H03M 7/42; H03M 7/40; H03M 7/46; H03M 7/18; H03M 7/30; H03M 7/4087;
(Continued)

(56) References Cited

U.S. PATENT DOCUMENTS 6,005,503 A * 12/1999 Burrows ................. H03M 7/40
341/67
7,193,541 B2 * 3/2007 O'Neill ................... H03M 7/40
341/65
(Continued)

FOREIGN PATENT DOCUMENTS

WO   WO 2008/059752 A1   5/2008

OTHER PUBLICATIONS

International Search Report dated Jul. 10, 2018 in PCT/JP2018/016227 filed on Apr. 20, 2018, 2 pages.
(Continued)

*Primary Examiner* — Linh V Nguyen
(74) *Attorney, Agent, or Firm* — Oblon, McClelland, Maier & Neustadt, L.L.P.

(57) ABSTRACT

An encoding/decoding technique is provided with which encoding can be performed using a small average number of bits even for a sequence of integer values including small non-zero values and having a distribution heavily biased toward small values. The present invention includes an integer encoding part 110 that, with respect to an inputted sequence of non-negative integer values $x\_n$, $n \in \{1, 2, \ldots, N\}$ (hereinafter referred to as an "integer sequence"), obtains a 1-bit code as a code corresponding to a run of integer values 0 of length L, a predetermined number which satisfies $2 \leq L \leq 2^{K-1}$, which is included in the integer
(Continued)

sequence and obtains a (K×x_n)-bit or (K×x_n+1)-bit code as a code corresponding to a set of a run of integer values 0 of length from 0 to L−1 and one non-zero integer value x_n included in the integer sequence, where K is assumed to be an integer equal to or larger than 2.

18 Claims, 11 Drawing Sheets

(58) Field of Classification Search
CPC ...... H03M 7/6017; H03M 7/607; H03M 7/02; H04N 19/13; H04N 19/124; H04N 19/61; H04N 19/11; H04N 19/60; H04N 19/184; G10L 19/00; G10L 19/12; G10L 19/032
USPC ...................................... 341/51, 67–69, 107
See application file for complete search history.

(56) References Cited

U.S. PATENT DOCUMENTS

| | | | | |
|---|---|---|---|---|
| 7,424,467 | B2 * | 9/2008 | Fontoura | G06F 16/951 |
| 7,965,207 | B2 * | 6/2011 | Hendrickson | H03M 7/04 |
| | | | | 341/67 |
| 10,404,276 | B1 * | 9/2019 | Thonangi | G06F 5/01 |
| 2006/0132334 | A1 * | 6/2006 | Malvar | H03M 7/48 |
| | | | | 341/50 |
| 2009/0015442 | A1 * | 1/2009 | Monro | H03M 7/02 |
| | | | | 341/51 |
| 2009/0267812 | A1 * | 10/2009 | Chen | H04N 19/61 |
| | | | | 341/67 |
| 2010/0027903 | A1 | 2/2010 | Takamura | |
| 2010/0265111 | A1 * | 10/2010 | Harada | G10L 19/06 |
| | | | | 341/107 |
| 2012/0092197 | A1 * | 4/2012 | Harada | H03M 7/40 |
| | | | | 341/67 |

OTHER PUBLICATIONS

Takamura et al., "Efficient Gaussian Source Coding Based on Distribution Mapping," The Journal of the Institute of Image Information and Television Engineers, vol. 61, No. 9, pp. 1357-1362, Sep. 2007 (total 6 pages).

Sugiura et al., "Optimal Golomb-Rice Code Extension for Lossless Coding of Low-Entropy Exponentially-Distributed Sources", IEEE Transactions on Information Theory, vol. 64, No. 4, pp. 3153-3161, Jan. 30, 2018 (total 8 pages).

H. S. Malvar, "Adaptive Run-Length / Golomb-Rice Encoding of Quantized Generalized Gaussian Sources with Unknown Statistics," in Proc. Data Compression Conference (DCC) 06, IEEE Computer Society, pp. 23-32, Mar. 2006 (total 10 pages).

* cited by examiner

| INPUT x | BINARY NOTATION | CODE (r = 0) | CODE (r = 1) | CODE (r = 2) |
|---|---|---|---|---|
| 0 | 0000 | 1 | 1 0 | 1 00 |
| 1 | 0001 | 01 | 1 1 | 1 01 |
| 2 | 0010 | 001 | 01 0 | 1 10 |
| 3 | 0011 | 0001 | 01 1 | 1 11 |
| 4 | 0100 | 00001 | 001 0 | 01 00 |
| 5 | 0101 | 000001 | 001 1 | 01 01 |
| 6 | 0110 | 0000001 | 0001 0 | 01 10 |
| 7 | 0111 | 00000001 | 0001 1 | 01 11 |
| 8 | 1000 | 000000001 | 00001 0 | 001 00 |
| 9 | 1001 | 0000000001 | 00001 1 | 001 01 |
| : | : | : | : | : |

FIG. 1

| PARTIAL SEQUENCE OF INTEGER VALUES | CODE |
|---|---|
|  |  |
| 1 | 01 |
| 2 | 01 00 |
| 3 | 01 00 00 |
| 4 | 01 00 00 00 |
| : | : |

FIG. 9A

| PARTIAL SEQUENCE OF INTEGER VALUES | CODE |
|---|---|
| 00 | 1 |
| 01 | 1 00 |
| 02 | 1 00 00 |
| 03 | 1 00 00 00 |
| 04 | 1 00 00 00 00 |
| : | : |

FIG. 9B

| PARTIAL SEQUENCE OF INTEGER VALUES | CODE |
|---|---|
| | |
| 1 | 001 |
| 2 | 001 000 |
| 3 | 001 000 000 |
| 4 | 001 000 000 000 |
| : | : |

FIG. 10A

| PARTIAL SEQUENCE OF INTEGER VALUES | CODE |
|---|---|
| | |
| 01 | 010 |
| 02 | 010 000 |
| 03 | 010 000 000 |
| 04 | 010 000 000 000 |
| : | : |

FIG. 10B

| PARTIAL SEQUENCE OF INTEGER VALUES | CODE |
|---|---|
| | |
| 001 | 011 |
| 002 | 011 000 |
| 003 | 011 000 000 |
| 004 | 011 000 000 000 |
| : | : |

FIG. 10C

| PARTIAL SEQUENCE OF INTEGER VALUES | CODE |
|---|---|
| 0000 | 1 |
| 0001 | 1 000 |
| 0002 | 1 000 000 |
| 0003 | 1 000 000 000 |
| 0004 | 1 000 000 000 000 |
| : | : |

FIG. 10D

ENCODING APPARATUS, DECODING APPARATUS, DATA STRUCTURE OF CODE STRING, ENCODING METHOD, DECODING METHOD, ENCODING PROGRAM AND DECODING PROGRAM

TECHNICAL FIELD

The present invention relates to a technique for encoding or decoding a sample sequence composed of integer values such as a sample sequence of voice or acoustic time-series digital signals.

BACKGROUND ART

As a technique for encoding a sample sequence for the purpose of compression, there is a technique that reduces a bit length used for description of a sample sequence by reversibly encoding finite precision values (hereinafter referred to as "integer values") obtained by quantizing sample values. In this technique, the code of which length is assigned to which integer value is directly connected to the performance of compression. This fact is no exception to engineering application of encoding/decoding of a sample sequence such as image encoding for encoding/decoding a sample sequence of an image signal, acoustic encoding for encoding/decoding a sample sequence of an acoustic signal.

Generally, in reversible encoding of variable length, there are constraints of the configuration of a code assigned to an integer value due to constraints of decoding possibility. More specifically, when a short code is assigned to a certain integer value, there is a constraint that a long code has to be assigned to another integer value to make the code decodable. Therefore, to improve the compression performance, a code configuration (assignment of code to each integer value) needs to be suitable for a distribution of values in a sequence of integer values. More specifically, it is possible to reduce an expected value of a compressed bit length of a sequence of integer values by assigning a short code to an integer value having a high appearance probability and assigning a long code to an integer value having a low appearance probability.

In the above-described reversible encoding, it is a Golomb-Rice code that has been used as one of simplest variable length codes. When a sequence of integer values belongs to a Laplacian distribution, that is, when an appearance probability of integer values is exponentially lowered with respect to the magnitude of the values, the Golomb-Rice code is known to achieve a minimum expected bit length (minimum bit length).

Since this Golomb-Rice code has an extremely simple configuration, it is widely used. The Golomb-Rice code is used, for example, to divide sample values included in a sequence of integer values obtained by AD converting an acoustic signal to PCM or a sequence obtained by Fourier transforming the aforementioned sequence into a frequency spectrum by a quantized value and to encode a sequence of absolute values of the obtained integer values. Alternatively, the Golomb-Rice code is used to encode a sequence of non-negative integer values obtained by substituting each sample value x by x' obtained from equation (1) below.

[Formula 1]

$$x' = \begin{cases} 2|x|-1 & \text{(if } x > 0) \\ 2|x| & \text{(otherwise)} \end{cases} \quad (1)$$

Therefore, although a case will be described below where non-negative integer values are encoded/decoded, it is possible to also make the Golomb-Rice code adaptable to encoding/decoding of all integer values based on the above-described fact that all integer values can be transformed into non-negative integer values in a one-to-one correspondence according to equation (1) or the like by transforming all integer values into non-negative integer values according to equation (1) or the like in a preceding stage of an encoding process or transforming non-negative integer values into all integer values through inverse transformation according to equation (1) or the like in a post stage of a decoding process.

In Golomb-Rice encoding, by appropriately selecting the value of a Rice parameter r, as shown in a table in FIG. 1, a bit length B(x) of a code corresponding to an input x of a non-negative integer value is assumed to be:

[Formula 2]

$$B(x) = \frac{x}{2^r} + r + 1 \quad (2)$$

and it is possible to perform encoding so as to give approximately optimal expectation bit length for a sequence of non-negative integer values following a one-sided Laplacian distribution below.

[Formula 3]

$$p(x, 2^r) = \frac{1}{Z_{2^r}} \cdot \frac{1}{2^{\frac{x}{2^r}}} \left( Z_{2^r} = \sum_{k=0}^{\infty} \frac{1}{2^{\frac{k}{2^r}}} \right) \quad (3)$$

Here, the Rice parameter r is a non-negative integer value. That is, if the Rice parameter r is a small non-negative integer value, it is possible to encode a sequence of values of large deviation with a small average number of bits, whereas if r is a large non-negative integer value, it is possible to encode a sequence of values of small deviation with a small average number of bits.

However, since the Rice parameter r cannot take a negative value in Golomb-Rice encoding, the compression efficiency deteriorates no matter how the Rice parameter r is set as a deviation of a value of the sequence such as a sequence of values following a distribution p (x, 0.1) becomes larger than the distribution p (x, 1).

For example, when an acoustic signal is AD converted to PCM, a representable range of numerical values is set to allow recording of up to a high sound volume, and so values included in a sequence of many signals tend to be biased toward small absolute values of the representable range of numerical values. A voice signal in particular includes a time section with no utterance, and so signal values are biased toward extremely small values with only zero values or background noise. Furthermore, a sequence of integer values obtained by dividing the values included in such a sequence of signals by a quantized value is also biased toward small values including more zero values than the original sequence due to quantization.

As a prior art for encoding a sequence of integer values biased toward zero values, there is a technique of Non-Patent Literature 1. The technique described in Non-Patent Literature 1 encodes zero values included in an inputted sequence of integer values with a predetermined fixed number of bits for the length of the run of zero values and Golomb-Rice encodes a value obtained by subtracting 1 from non-zero values included in the inputted sequence of integer values (value −1).

As a prior art for encoding a sequence of integer values biased toward small values including zero values, there is a technique described in Non-Patent Literature 2. The technique in Non-Patent Literature 2 associates a set of two integer values with one integer value so as to be bijective with each other in advance, transforms the set of two integer values into one integer value and Golomb-Rice encodes the transformed sequence of integer values.

PRIOR ART LITERATURE

Non-Patent Literature

Non-Patent Literature 1: H. S. Malvar, "Adaptive Run-Length/Golomb-Rice Encoding of Quantized Generalized Gaussian Sources with Unknown Statistics", in Proc. Data Compression Conference (DCC) 06, IEEE Computer Society, pp. 23-32, March 2006.

Non-Patent Literature 2: Masayuki Takamura, Yoshiyuki Yajima, "Efficient Gaussian Source Coding Based on Distribution Mapping," the journal of the Institute of Image Information and Television Engineers, Vol. 61, No. 9, pp. 1357-1362, 2007

SUMMARY OF THE INVENTION

Problems to be Solved by the Invention

According to the technique in Non-Patent Literature 1, encoding can be performed with a small average number of bits for zero values. However, the technique of Non-Patent Literature 1 performs substantially the same encoding as Golomb-Rice encoding for non-zero values, and so when small non-zero values are biased more heavily than the distribution p (x, 1), there is a problem with the technique of Non-Patent Literature 1 that compression performance deteriorates.

Furthermore, the technique in Non-Patent Literature 1 is not any encoding method corresponding to a mathematically represented distribution. Therefore, the technique in Non-Patent Literature 1 also involves a problem that it is not possible to know what number of bits used to represent the length of the run of zero values should be selected for encoding so as to be able to encode the zero values with a small average number of bits even if the distribution of values in the sequence of integer values is known.

On the other hand, according to the technique in Non-Patent Literature 2, a sequence of integer values more heavily biased than the distribution p (x, 1) can be encoded with a small average number of bits. However, the technique in Non-Patent Literature 2 cannot make the average number of bits for one integer value smaller than 0.5 bits and involves a problem that compression performance deteriorates for a sequence of integer values with such a large deviation that a theoretically optimal average number of bits is less than 0.5 bits.

It is therefore an object of the present invention to provide an encoding/decoding technique capable of encoding, with a small average number of bits, even a sequence of integer values including also small non-zero values and having a distribution heavily biased toward small values.

Means to Solve the Problem

One aspect of the present invention comprises an integer encoding part that obtains, for an inputted sequence of non-negative integer values $x\_n$, $n \in \{1, 2, \ldots, N\}$ (hereinafter referred to as an "integer sequence"), a 1-bit code (hereinafter referred to as a "code A") as a code corresponding to a run of integer values 0 of length L, a predetermined number which satisfies $2 L 2^{K-1}$, which is included in the integer sequence, and obtains a $(K \times x\_n)$-bit or $(K \times x\_n+1)$-bit code (hereinafter referred to as a "code B") as a code corresponding to a set of a run of integer values 0 of length from 0 to L−1 and one non-zero integer value $x\_n$ included in the integer sequence, where K is assumed to be an integer equal to or larger than 2.

Another aspect of the present invention comprises an integer decoding part that obtains a sequence of integer value $x\_n$, $n \in \{1, 2, \ldots, N\}$ by obtaining, for an inputted code string, a nm of integer values 0 of length L, a predetermined number which satisfies $2 \leq L \leq 2^{K-1}$, from a 1-bit code (hereinafter referred to as a "code A") included in the inputted code string, and obtaining a set of a run of integer values 0 of length from 0 to L−1 and one non-zero integer value $x\_n$ from a $(K \times x\_n)$-bit or $(K \times x\_n+1)$-bit code (hereinafter referred to as a "code B") included in the inputted code string, where K is assumed to be an integer equal to or larger than 2.

A further aspect of the present invention is a data structure of a code string representing a sequence of non-negative integer values $x\_n$, $n \in \{1, 2, \ldots, N\}$ (hereinafter referred to as an "integer sequence"), the code string being used for an encoding apparatus that obtains the code string from the integer sequence or/and a decoding apparatus that obtains the integer sequence from the code string, the data structure comprising a 1-bit code (hereinafter referred to as a "code A") which is a code corresponding to a run of integer values 0 of length L, a predetermined number which satisfies $2 \leq L \leq 2^{K-1}$, which is included in the integer sequence, and a $(K \times x\_n)$-bit or $(K \times x\_n+1)$-bit code (hereinafter referred to as a "code B") which is a code corresponding to a set of a run of integer values 0 of length from 0 to L−1 and one non-zero integer value $x\_n$ included in the integer sequence, where K is assumed to be an integer equal to or larger than 2.

Effects of the Invention

According to the present invention, it is possible to encode, with a small average number of bits, even a sequence of integer values including small non-zero values and heavily biased toward small values or a sequence of integer values biased to an extent that cannot be covered by the technique in Non-Patent Literature 2. Furthermore, it is possible to decode such a code.

BRIEF DESCRIPTION OF THE DRAWINGS

FIG. 1 is a diagram illustrating a Golomb-Rice code corresponding to an input x of a non-negative integer value;

FIG. 9A is a diagram illustrating an example of a correspondence table when K=2;

FIG. 9B is a diagram illustrating an example of a correspondence table when K=2;

FIG. 10A is a diagram illustrating an example of a correspondence table when K=3;

FIG. 10B is a diagram illustrating an example of a correspondence table when K=3;

FIG. 10C is a diagram illustrating an example of a correspondence table when K=3;

FIG. 10D is a diagram illustrating an example of a correspondence table when K=3;

DETAILED DESCRIPTION OF THE EMBODIMENTS

Figure 2:
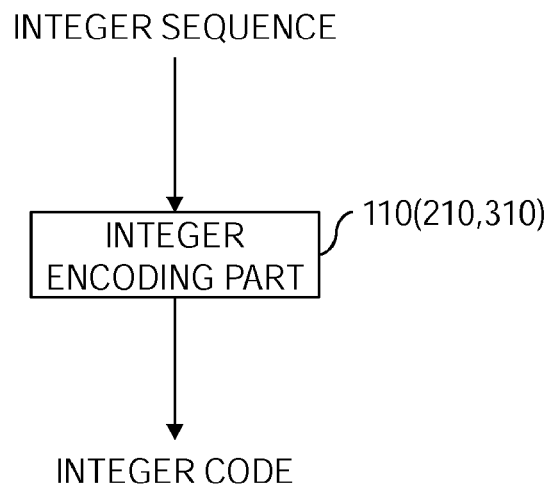
FIG. 2 is a block diagram illustrating an example of a configuration of an encoding apparatus 100 (200, 300)

Hereinafter, embodiments of the present invention will be described in detail. Note that components having the same functions are assigned the same reference numerals and duplicate description thereof will be omitted.

First Embodiment

<<Encoding Apparatus>>

Figure 3:
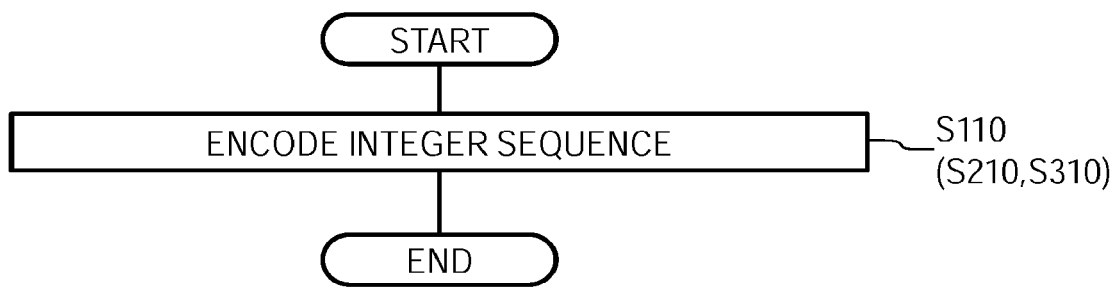
FIG. 3 is a flowchart illustrating an example of operation of the encoding apparatus 100 (200, 300)

A processing procedure for an encoding method executed by an encoding apparatus 100 of a first embodiment will be described with reference to FIG. 2 and FIG. 3. As shown in FIG. 2, the encoding apparatus 100 of the first embodiment includes an integer encoding part 110. The encoding method of the first embodiment is implemented by the encoding apparatus 100 of the first embodiment executing processes in respective steps shown in FIG. 3.

A sequence of non-negative integer values is inputted to the encoding apparatus 100 of the first embodiment. As the sequence of non-negative integer values, for example, a sequence of absolute values of integer values obtained from some or all of signals obtained by transforming voice collected using a microphone, music or the like into a digital signal or by transforming images or video captured by a camera into a digital signal and quantizing the digital signal using an existing technique into finite precision values or a sequence of x' obtained according to equation (1) assuming an integer value as x may be inputted.

The encoding apparatus 100 of the first embodiment variable-length encodes a sequence of non-negative integer values using a plurality of predetermined code trees according to a predetermined rule to thereby implement an encoding process resulting in a shorter bit length than Golomb-Rice encoding on a sequence of non-negative integer values having a distribution more heavily biased than a Laplacian distribution. Here, the "code tree" refers to a graph representing a predetermined rule as to which code is to be assigned to an inputted non-negative integer value. In the following description, non-negative integer values inputted to the encoding apparatus 100 of the present embodiment will be simply referred to as "integer values."

[Integer Encoding Part 110]

A sequence of integer values inputted to the encoding apparatus 100 is inputted to the integer encoding part 110 by N samples (N is a natural number) at a time. The inputted sequence of integer values is assumed to be an integer sequence $x\_1, x\_2, \ldots, x\_N$. The integer encoding part 110 encodes the integer sequence $x\_1, x\_2, \ldots, x\_N$ through an encoding process using the following code tree based on an encoding parameter K which is a natural number equal to or larger than 2 inputted by predetermined means (not shown) to obtain a code and outputs the obtained code as an integer code (S110). Hereinafter, description will be given assuming that each integer of the integer sequence $x\_1, x\_2, \ldots, x\_N$ is $x\_n$ (n is a sample number in the sequence, $n \in \{1, 2, \ldots, N\}$).

[[Code Tree Used for Encoding Process]]

First, a code tree used for an encoding process in the integer encoding part 110 will be described.

Figure 4:
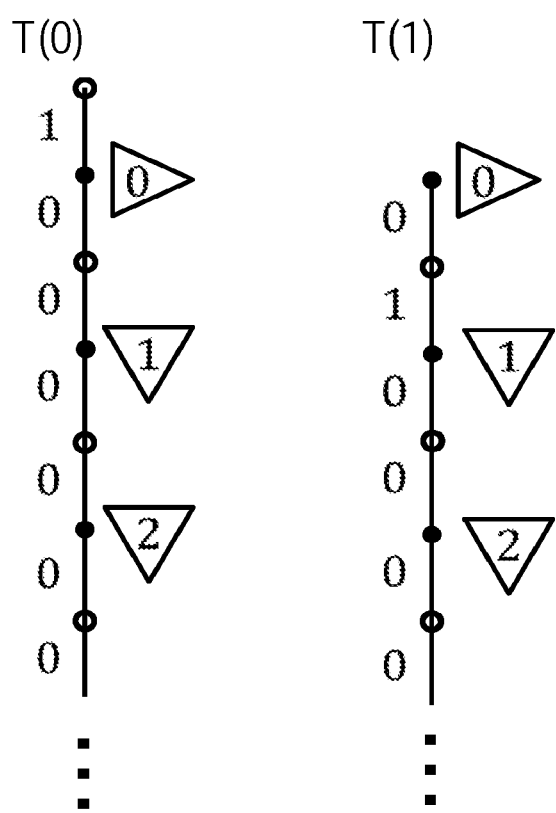
FIG. 4 is a diagram illustrating an example of a code tree when K=2.
Figure 5:
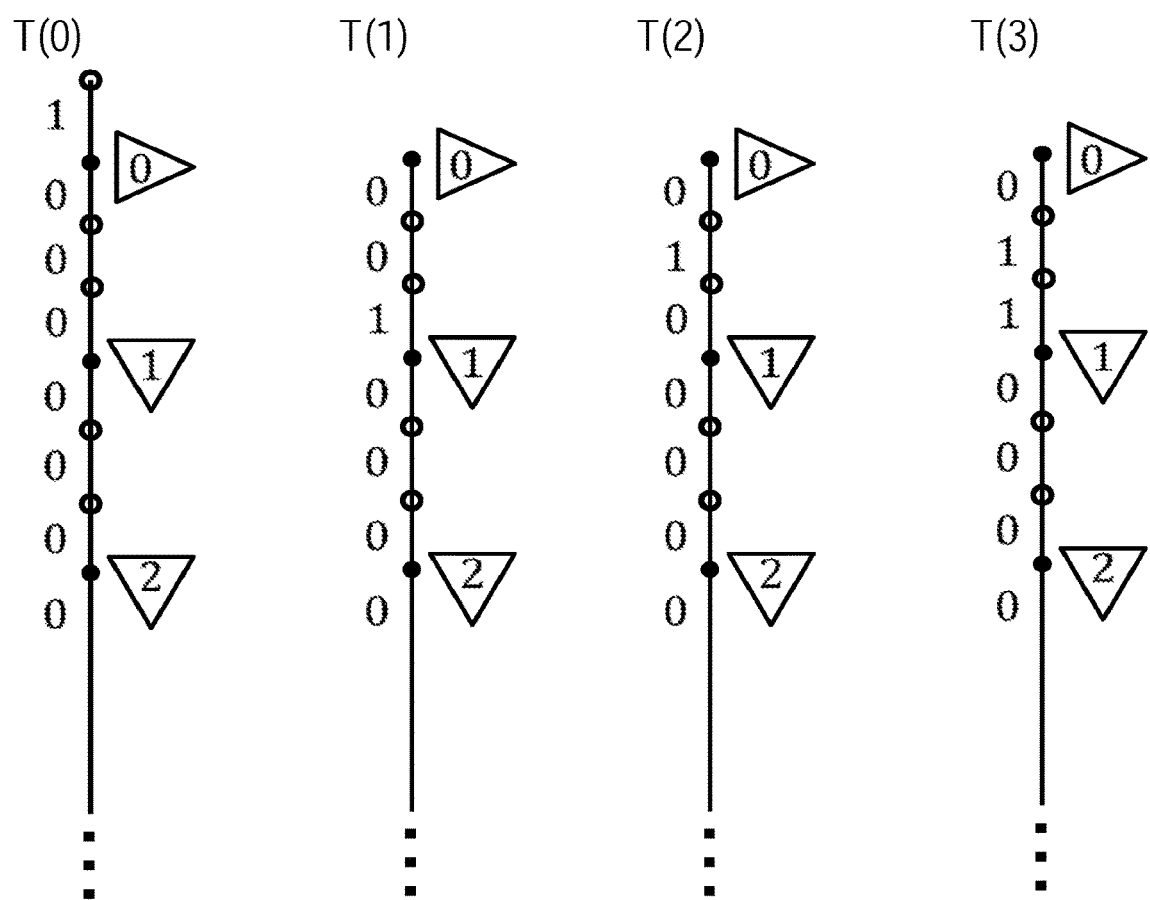
FIG. 5 is a diagram illustrating an example of a code tree when K=3.
Figure 6:
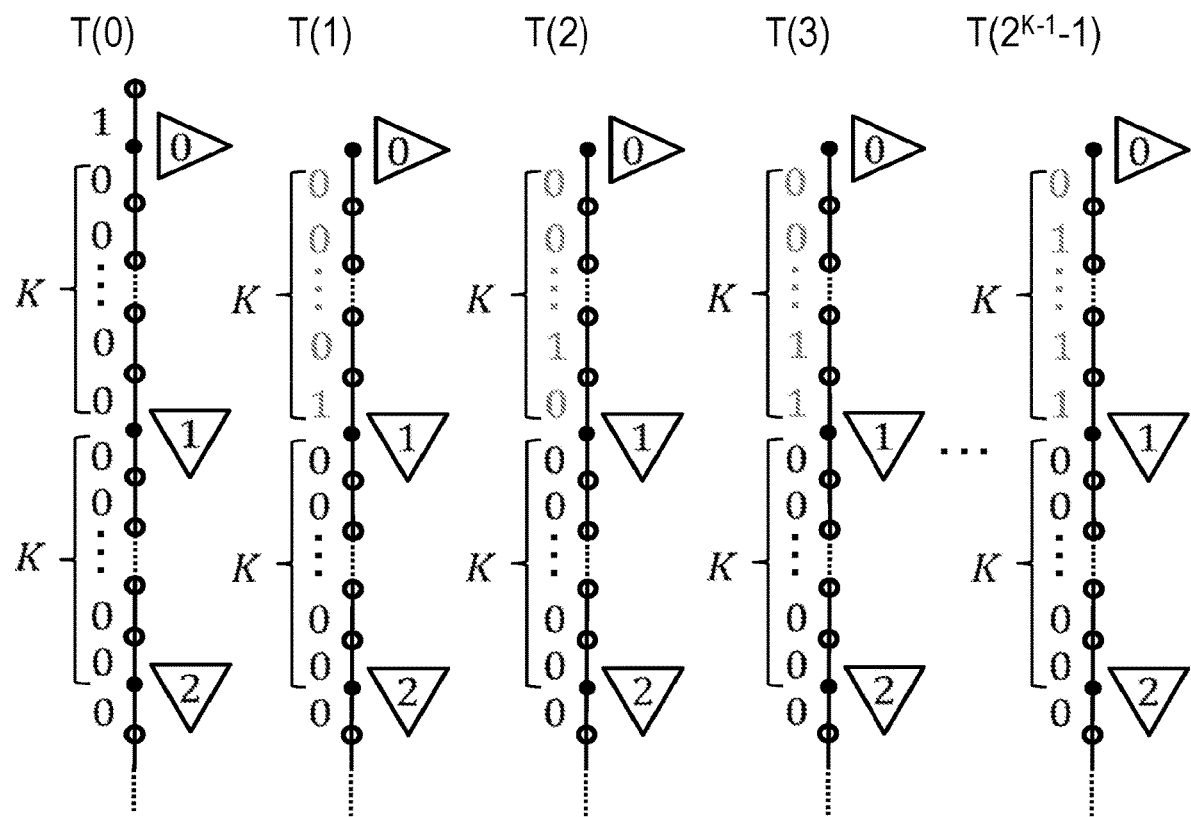
FIG. 6 is a diagram illustrating an example of a code tree when K is generalized.

The integer encoding part 110 stores $2^{K-1}$ (2 to the (K−1)-th power) code trees in advance as illustrated in FIG. 4 to FIG. 6. FIG. 4 shows an example of a code tree when K=2, and T(0) and T(1) are code trees respectively. FIG. 5 shows an example of a code tree when K=3, and T(0) to T(3) are code trees respectively. FIG. 6 shows an example of a code tree when K is generalized, and T(0) to T($2^{K-1}-1$) are code trees respectively. Hereinafter, a number in parentheses attached to T will be called a "code tree number."

[[Relationship between Inputted Integer Value and Code Corresponding to Integer Value in Code Tree]]

Next, a relationship between an inputted integer value and a code corresponding to the integer value in each code tree will be described.

An integer value enclosed by a triangle to the right of a node on each code tree corresponds to an inputted integer value. Bit values '0' and '1' on the left side of an edge of each code tree correspond to a rule of a code assigned to the inputted integer value. This rule is a rule according to which a sequence of bit values arranged on the left side of the edge from a node at a top end of the code tree to a node corresponding to the inputted integer value are obtained as codes to be assigned to the inputted integer values.

One of the $2^{K-1}$ code trees corresponds to T(0) in FIG. 4 to FIG. 6 and is a code tree corresponding to a rule for obtaining codes that the number of bits is (K×x\_n+1) as the codes corresponding to the inputted integer value x\_n, the bit value of the first 1 bit is '1' and the bit values of the second bit to the (K×x\_n+1)-th bit are '0.' Note that according to this code tree, when the inputted integer value x\_n is 0, since the number of bits K×x\_n+1 of the code is one, a code of 1 bit whose bit value is T is obtained.

Of the $2^{K-1}$ code trees, ($2^{K-1}-1$) code trees other than the one described above correspond to T(1) to T($2^{K-1}-1$) in FIG. 4 to FIG. 6, and as a code corresponding to the inputted integer value x\_n, the number of bits is K×x\_n, the bit value of the first bit is '0' and the bit value of at least 1 bit of (K−1) bits from the second bit to the K-th bit is '1' and the bit values of the K×(x_n−1) bits from the (K+1)-th bit to the (K×x_n)-th bit are '0.' That is, this is a code tree corresponding to a rule for obtaining a code whose bit value of the K×(x_n−1)-th bit from the last is '0.' Here, the (K−1) bits from the second bit to the K-th bit constitute a bit group corresponding to ($2^{K-1}$−1) code trees from the second bit to the K-th bit one to one. Note that according to these code trees, when the inputted integer value x_n is 0, the number of bits of the code K×x_n is 0, which means that no code is obtained.

For example, in the case of K=2 in FIG. 4, the rule applicable to an inputted integer value and a code corresponding to the integer value is such a rule that when an inputted integer value 0 is encoded by the code tree T(0), '1' is obtained as a code corresponding to the inputted integer value 0, when an inputted integer value 1 is encoded by the code tree T(0), '100' is obtained as a code corresponding to the inputted integer value 1, when an inputted integer value 2 is encoded by the code tree T(0), '10000' is obtained as a code corresponding to the inputted integer value 2, when the inputted integer value 0 is encoded by the code tree T(1), no code corresponding to the inputted integer value 0 is obtained, when the inputted integer value 1 is encoded by the code tree T(1), '01' is obtained as a code corresponding to the inputted integer value 1, and when the inputted integer value 2 is encoded by the code tree T(1), '0100' is obtained as a code corresponding to the inputted integer value 2.

[[Rule Using Plurality of Code Trees]]

Next, a rule using a plurality of code trees will be described. The integer encoding part 110 also stores a rule using a plurality of code trees in advance.

The orientation of a triangle in which each integer value is enclosed, to the right of each node on each code tree in FIG. 4 to FIG. 6 corresponds to a rule using a plurality of code trees.

A right-facing triangle represents a rule for using a code tree on the right side (a code tree with one larger code tree number) when encoding an integer value next to the inputted integer value. Note that it is assumed in such a case that the right side of a rightmost code tree (code tree with the largest code tree number) corresponds to the leftmost code tree (code tree with the smallest code tree number). Note that this rule is merely an example and any rule may be used if it is a cyclic rule to use multiple code trees. That is, for each code tree, in the case of a right-facing triangle, any rule may be adopted for using a code tree different from that for encoding the next integer value when the right-facing triangle is used, if such a rule for all code trees prevents a code tree used for encoding the next integer value in the case of a right-facing triangle from overlapping. Note that for the cyclic rule to use multiple code trees, the maximum number of code trees used is $2^{K-1}$.

A down-facing triangle represents a rule for using a code tree T(1) when encoding an integer value next to the inputted integer value. Note that this rule is also merely an example and any rule may be used if it is a rule that for each down-facing triangle, any one predetermined code tree is used for encoding the next integer value. For example, when the down-facing triangle is used, the rule may be such that any one identical code tree predetermined for all the down-facing triangles is a code tree used for encoding the next integer value. Furthermore, to reduce the average number of bits, the rule may be such that when the down-facing triangle is used, a code tree other than the code trees corresponding to T(0) in FIG. 4 to FIG. 6 is used as a code tree used for encoding the next integer value.

Note that to minimize the average number of bits, it is preferable to use such a rule that in the case of a right-facing triangle, all the $2^{K-1}$ code trees are cyclically used and for all code trees, in the case of a down-facing triangle, a code tree used for encoding the next integer value in the case of a right-facing triangle for the code tree corresponding to T(0) in FIG. 4 to FIG. 6 is assumed to be a code tree used for encoding the next integer value.

For example, the rule for encoding using a code tree when K=2 in FIG. 4 is a rule that when an inputted integer value 0 is encoded using the code tree T(1), the code tree used to encode the next integer value without obtaining a code corresponding to the inputted integer value 0 is assumed to be T(0) and when an inputted integer value 2 is encoded using the code tree T(0), '10000' is obtained as a code corresponding to the inputted integer value 2 and the code tree used to encode the next integer value is assumed to be T(1).

Any one of the plurality of code trees may be used at the beginning of an encoding process, but a rule about which code tree is used at the beginning of the encoding process is also stored in advance as a rule for using a plurality of code trees. For example, when K=2 in FIG. 4, if an integer sequence x_1, x_2, . . . , x_N is encoded in order from an integer value x_1, a rule that the integer value x 1 is encoded with T(0) may be used or a rule that the integer value x_1 is encoded with T(1) may be used, in which case which of T(0) or T(1) is to be used for encoding of the integer value x_1 may be predetermined and stored in advance.

[[Encoding Process Using Code Tree]]

Using the aforementioned plurality of code trees and according to the aforementioned rule for using the plurality of code trees, the integer encoding part 110 encodes integer values included in the inputted integer sequence x_1, x_2, . . . , x_N in predetermined order to obtain a code and outputs the obtained code as an integer code. For example, when the predetermined order is order of sample numbers in the sequence and the code tree used first is T(0), the encoding procedure carried out by the integer encoding part 110 is as follows.

(Encoding Procedure)

1. Initial values of sample number n and code tree number are assumed to be 1 and 0 respectively.
2. Steps (i) to (iv) below are repeated until n=N.
 (i) If code tree number is 0, code '1' is obtained.
 (ii) If integer value x_n=0, a number obtained by adding 1 to a code tree number is assumed to be a new code tree number. In this case, when the code tree number resulting from an addition of 1 is $2^{K-1}$, 0 is assumed to be a new code tree number.
 (iii) When integer value x_n≠0, a K-bit code composed of 1-bit '0' and (K−1) bits in a one-to-one correspondence with a code tree is obtained, and K×(x_n−1)-bit code '0' is further obtained and '1' is assumed to be a new code tree number.
 (iv) A number obtained by adding 1 to n is assumed to be a new n.
3. Of the codes obtained in steps 1 and 2, the first obtained code '1' is removed.
 (Alternatively, the initial first operation of 2. (i) is not performed.)
4. A code '1' (terminating code) is added to an end of the code obtained in steps 1 to 3.
5. The codes obtained in steps 1 to 4 are outputted as integer codes.

Note that execution of step 3 of the encoding procedure is not essential. When the code tree used first is T(0), the first obtained code among the codes obtained in steps 1 and 2 is '1' no matter what the value of x_1 may be. Therefore, even when the encoding apparatus 100 outputs a code resulting from removing the first obtained code '1' as the integer code, if the decoding apparatus 150 adds a code '1' to the beginning of the inputted integer code, it is possible for the decoding apparatus 150 to perform a decoding process corresponding to the encoding process carried out by the integer encoding part 110 of the encoding apparatus 100. From this, in step 3 of the encoding procedure, the first obtained code '1' is removed. However, step 3 of the encoding procedure need not always be performed and the first obtained code '1' need not be removed from among the codes obtained in steps 1 and 2. In this case, it is possible to prevent the corresponding decoding apparatus 150 from performing the process of adding a code '1' to the beginning of the inputted integer code and step 3 of the encoding procedure needs not be performed.

Step 4 of the encoding procedure needs not be performed depending on how to transmit integer codes from the encoding apparatus 100 to the decoding apparatus 150. Although the decoding procedure in the decoding apparatus 150 will be described later, in order for the decoding apparatus 150 to perform a decoding process corresponding to the encoding process performed by the integer encoding part 110, the decoding apparatus 150 needs to be able to identify a termination end of an integer code. As a configuration for the encoding apparatus 100 to transmit an integer code to the decoding apparatus 150, it is possible to adopt, for example, a configuration in which integer codes obtained for the integer sequence x_1, x_2, . . . , x_N in the encoding apparatus 100 or in a post stage of the encoding apparatus 100 are stored in a packet using a well-known packetizing technique and transmitted to the decoding apparatus 150. In this case, on the decoding side, a configuration of extracting integer codes from the packet in the decoding apparatus 150 or in a pre-stage of the decoding apparatus 150 is adopted, and therefore the decoding apparatus 150 can identify the termination end of the integer code. Therefore, in such a case, step 4 of the encoding procedure needs not be performed. As the configuration of transmitting an integer code from the encoding apparatus 100 to the decoding apparatus 150, it may be possible to adopt a configuration of connecting another code to the rear of integer codes obtained for the integer sequence x_1, x_2, . . . , x_N, storing them in the aforementioned packet and transmitting them to the decoding apparatus 150 or a configuration of connecting another code to the rear of integer codes obtained for the integer sequence x_1, x_2, . . . , x_N without the aforementioned packetization and transmitting them to the decoding apparatus 150. When step 4 of the encoding procedure in these configurations is not performed, if the code connected to the rear is '0000,' the decoding apparatus 150 cannot determine how far the code corresponding to the N-th integer value reaches and from where the code connected to the rear starts. Therefore, in these configurations, the same predetermined value of N needs to be stored in the encoding apparatus 100 and the decoding apparatus 150 so as to allow the decoding apparatus 150 to grasp that the integer codes correspond to the N integer values and step 4 of the encoding procedure needs also to be performed so that the decoding apparatus 150 may identify the termination end of the integer code.

Note that code '0' in the aforementioned description is an example of any one of the two bit values and code '1' in the aforementioned description is an example of the other bit value of the two bit values. That is, as a matter of course, code '1' may be used instead of code '0' and code '0' may be used instead of code '1' in the aforementioned description.

[[Example of Encoding Process]]

As an example of an encoding process, an encoding process in the case where the code tree used first when K=2 is T(0) and the inputted integer sequence x_1, x_2, x_3, x_4, x_5 is 0, 0, 2, 0, 0 will be described. Since the first integer value x_1=0 is encoded with T(0), code '1' is obtained and since the code tree number 0 plus 1 is assumed to be a new code tree number, the code tree used for encoding the next integer value x_2=0 is assumed to be T(1). Since the next integer value x_2=0 is encoded with T(1), no code is obtained and the code tree number 1 plus 1 is assumed to be a code tree number, but since the code tree number plus 1 becomes $2^{K-1}$, 0 is assumed to be a new code tree number and the code tree used for encoding the next integer value x_3=2 is assumed to be T(0). Since such a rule is adopted that the third integer value x_3=2 is encoded with T(0), a code '10000' is obtained and a new code tree number is assumed to be 1, the code tree used for encoding the next integer value x_4=0 is assumed to be T(1). Since the fourth integer value x_4=0 is encoded with T(1), no code is added thereto and the code tree is made to transition from T(1) to T(0). Since the last integer value 0 is encoded with T(0), code '1' is obtained. Since the code obtained so far is '1100001' but when step 3 of the aforementioned encoding procedure is performed and step 4 of the aforementioned encoding procedure is not performed, the first obtained code '1' is omitted and a final integer code '100001' is obtained.

<<Decoding Apparatus>>

Figure 7:
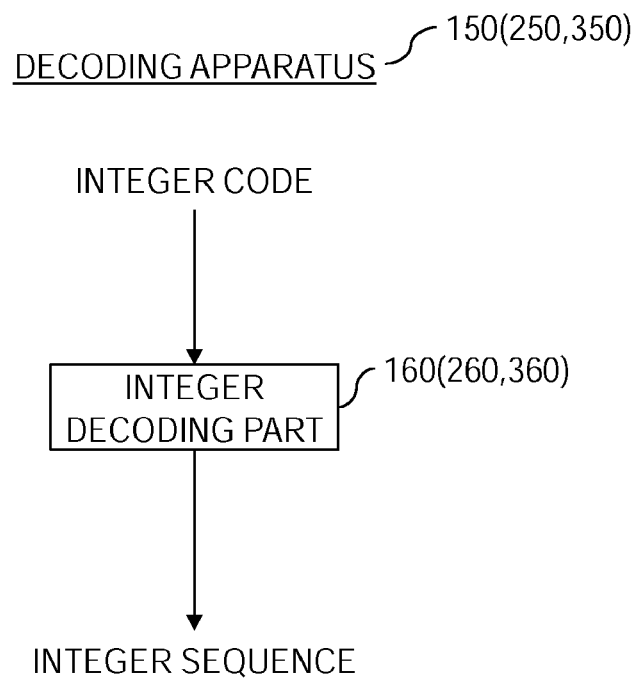
FIG. 7 is a block diagram illustrating an example of a configuration of a decoding apparatus 150 (250, 350)
Figure 8:
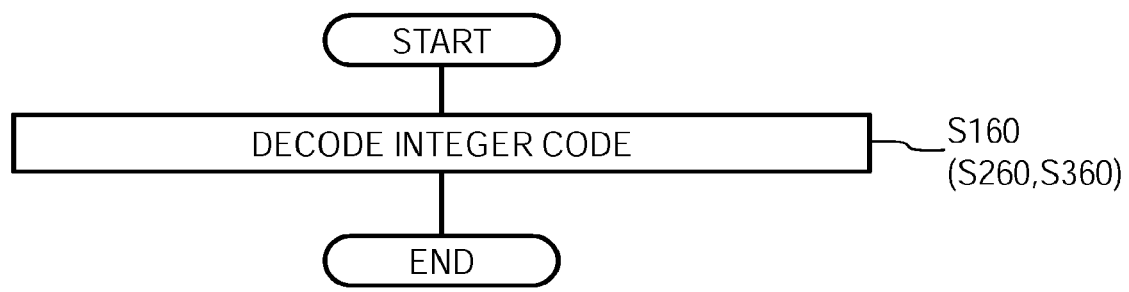
FIG. 8 is a flowchart illustrating an example of operation of the decoding apparatus 150 (250, 350)

A processing procedure for the decoding method executed by the decoding apparatus 150 of the first embodiment will be described with reference to FIG. 7 and FIG. 8. As shown in FIG. 7, the decoding apparatus 150 of the first embodiment includes an integer decoding part 160. The decoding method of the first embodiment is implemented by the decoding apparatus 150 of the first embodiment executing processes in respective steps shown in FIG. 8.

An integer code outputted by the encoding apparatus 100 of the first embodiment is inputted to the decoding apparatus 150 of the first embodiment. The decoding apparatus 150 of the first embodiment decodes the inputted integer code through a decoding process using a plurality of predetermined code trees corresponding to the encoding apparatus 100 of the first embodiment according to a predetermined rule corresponding to the encoding apparatus 100 of the first embodiment, obtains a sequence of non-negative integer values to thereby reconstruct the sequence of non-negative integer values inputted to the encoding apparatus 100 of the first embodiment itself. In the following description, non-negative integer values will be simply referred to as "integer values" as with the description of the aforementioned encoding apparatus 100.

[Integer Decoding Part 160]

The integer code inputted to the decoding apparatus 150 is inputted to the integer decoding part 160. The integer decoding part 160 decodes the inputted integer code through the decoding process using the following code trees based on an encoding parameter K which is a natural number equal to or larger than 2 inputted by predetermined means (not shown) which is the same value as the encoding parameter K used by the integer encoding part 110 of the encoding apparatus 100, obtains a sequence of integer values and outputs the obtained integer sequence x_1, x_2, . . . , x_N (S160). Description will be given hereinafter assuming that each integer of the integer sequence x_1, x_2, . . . , x_N is x_n (n is a sample number in the sequence, and n∈{1, 2, . . . , N}).

Code trees used for the decoding process are the same code trees used by the integer encoding part 110 of the encoding apparatus 100 of the first embodiment and the integer decoding part 160 stores $2^{K-1}$ (2 to the (K−1)-th power) code trees in advance as illustrated in FIG. 4 to FIG. 6. The relationship between an inputted code on a code tree and integer values corresponding to the code in the decoding process, and a rule for using a plurality of code trees correspond to the rule in the encoding process of the integer encoding part 110 of the encoding apparatus 100 of the first embodiment, and is the rule whereby the "code to be assigned to the inputted integer value" in the rule in the encoding process of the integer encoding part 110 of the encoding apparatus 100 of the first embodiment is read as the "inputted code" and the "inputted integer value" is read as the "integer value to be assigned to the inputted code" and is stored in the integer decoding part 160 in advance. Note that the value of the parameter K used for the decoding process is the same value as the parameter K used by the integer encoding part 110 of the encoding apparatus 100 of the first embodiment, and is stored in the integer decoding part 160 in advance. Furthermore, the rule about which code tree is to be used first in the decoding process is also the same rule as the rule used by the integer encoding part 110 of the encoding apparatus 100 of the first embodiment and is stored in the integer decoding part 160 in advance.

Using the aforementioned plurality of code trees and according to the aforementioned rule for using a plurality of code trees, the integer decoding part 160 obtains a sequence of integer values corresponding to the inputted integer code, arranges the respective integers of the obtained sequence of integer values in predetermined order, and obtains and outputs the integer sequence as the integer sequence x_1, x_2, . . . , x_N. For example, when the predetermined order is a sample number order in the sequence and the code tree used first is T(0), the decoding procedure carried out by the integer decoding part 160 is, for example, a decoding procedure 1 and a decoding procedure 2 shown below.

(Decoding Procedure 1-1) When no terminating code is added according to the encoding procedure 4, that is, when the decoding apparatus 150 can identify a termination end of an integer code,
1. When code '1' is removed in the encoding procedure 3, a code '1' is added to the beginning of the integer code.
2. The initial value of the code tree number is assumed to be 0.
3. The following steps (i) and (ii) are repeated until no more unread integer code is left and when there is no more integer code is left, the process proceeds to step 4.
(i) The inputted integer codes are read in order while there are codes corresponding to codes read into a code tree corresponding to the code tree number (that is, up to an immediately preceding bit where there is no more code corresponding to the code read into the code tree corresponding to the code tree number).
(ii) An integer value corresponding to the code corresponding to the code read from the code tree corresponding to the code tree number is obtained and a new code tree number is obtained according to a rule of transition of the code tree about the integer value of the code tree.
4. A sequence of the integer values obtained in 3. (ii) is outputted as an integer sequence x_1, x_2, . . . , x_N.

(Decoding Procedure 1-2) When a terminating code is added according to the encoding procedure 4, that is, when the decoding apparatus 150 cannot identify an end of the integer code,
1. When a code '1' is removed in the encoding procedure 3, the code '1' is added to the beginning of an inputted code string (a code string made up of an integer code and another subsequent code).
2. Initial values of sample number n and code tree number are assumed to be 1 and 0 respectively.
3. Steps (i) and (ii) below are repeated until n=N.
(i) The inputted code strings are read in order while there are codes corresponding to codes read into a code tree corresponding to the code tree number (that is, up to an immediately preceding bit where there is no more code corresponding to the code read into the code tree corresponding to the code tree number).
(ii) An integer value corresponding to the code corresponding to the code read from the code trees corresponding to the code tree numbers is obtained and a new code tree number is obtained according to the rule of transition of the code tree about the integer values of the code tree and n plus 1 is assumed to be a new n.
4. A sequence of the integer values obtained in 3. (ii) is outputted as an integer sequence x_1, x_2, . . . , x_N.

(Decoding Procedure 2)
1. When the terminating code is not added in the encoding procedure 4, a terminating code '1' is added to the end of the inputted code string. When the code '1' is not removed in the encoding procedure 3, the code '1' is removed from the beginning of the inputted code string.
2. Initial values of sample number n and code tree number are assumed to be 1 and 0 respectively.
3. Steps (i) to (v) below are repeated until
(i) While all K bits are codes '0', the inputted code strings are read in order by K bits at a time and a number obtained by dividing the number of read codes '0' by K is assumed to be L.
(ii) When the code tree number is 0, an integer value L is obtained.
(iii) When the code tree number is not 0, an integer value (L+1) is obtained.
(iv) When the next 1 bit of the inputted code string is a code '1,' the 1 bit is read to obtain $(2^{K-1}-1)$ integer values 0, 0 is set as a new code tree number and n plus $2^{K-1}$ is assumed to be a new n.
(v) When the next 1 bit of the inputted code string is a code '0,' K bits including the 1 bit are read, the number corresponding to the code of the K bits is assumed to be a new code tree number, (new code tree number −1) integer values 0 are obtained and n plus the new code tree number is assumed to be a new n.
4. When the number of obtained integer values is larger than N, (N+1)-th and subsequent integer values are removed.

[[Example of Decoding Process]]

As an example of the decoding process, when the code tree first used when K=2 is T(0), a decoding process when the integer code '100001' obtained in the above-described example of the encoding process is decoded using the aforementioned decoding procedure 1-1 will be described. First, a code '1' is added to the head of the integer code '100001' and the integer code is assumed to be '1100001.' Next, '1' which is the first 1 bit of an integer code '1100001' is a code corresponding to the code tree T(0), but since '11' which is the first 2 bits has no code corresponding to the code tree T(0), '1' which is the first 1 bit of the integer code is read, an integer value 0 corresponding to '1' is obtained and the code tree to be used next is assumed to be T(1). Next, since '1' which is the first 1 bit of remaining '100001' of the integer code has no corresponding code in the code tree T(1), an integer value 0 corresponding to 0 bits without reading the first 1 bit is obtained, and the code tree to be used next is assumed to be T(0). Next, although '1' which is the first 1 bit of the remaining '100001' of the integer code to '10000' which is the first 5 bits have their corresponding codes in the code tree T(0), '100001' which is the remaining first 6 bits of the integer code have no corresponding code in the code tree T(0), and so '10000' which is the first 5 bits of the remaining '100001' of the integer code is read, an integer value 2 corresponding to '10000' is obtained and the code tree to be used next is assumed to be T(1). Next, since the remaining '1' of the integer code has no corresponding code in the code tree T(1), the first 1 bit is not read either, an integer value 0 corresponding to 0 bits is obtained and the code tree to be used next is assumed to be T(0). Next, the remaining '1' of the integer code has its corresponding code in the code tree T(0), and since there are no integer codes which have not been read in '1' and subsequent bits, an integer value 0 corresponding to '1' is obtained and a sequence of integer values 0, 0, 2, 0, 0 obtained through these processes is outputted as an integer sequence x 1, x 2, x_3, x_4, x_5.

<Description of Principles of Invention>

Here, principles of the present invention will be described.

According to the encoding apparatus 100 of the first embodiment, it is possible to assign codes to all non-negative integer values and reconstruct the non-negative integer values themselves by the decoding apparatus 150 of the first embodiment decoding the codes. As shown in FIG. 4 to FIG. 6, a code corresponding to a non-negative integer value x_n consists of K×x_n bits or (K×x_n+1) bits. From this, the code of the present invention used in the first embodiment is a code that provides an approximate optimal expected bit length for a sequence of non-negative integer values following a one-sided Laplacian distribution having a large deviation as shown below, which is a code capable of reducing an average number of bits with respect to a sequence of non-negative integer values heavily biased toward small values compared to a Golomb-Rice code.

[Formula 4]

$$p(x, 1/K) = \frac{1}{Z_{1/K}} \cdot \frac{1}{2^{Kx}} \left( Z_{1/K} = \sum_{k=0}^{\infty} \frac{1}{2^{Kk}} \right) \quad (4)$$

It is seen from the correspondence relationship between a distribution p (x, $2^r$) where the Golomb-Rice code shown in equation (3) is optimum and a distribution p (x, 1/K) where the code of the present invention shown in equation (4) is optimum, that the logarithm of the reciprocal of the parameter K corresponds to the Rice parameter r. Furthermore, since the encoding parameter K of the present invention is a positive integer value, the logarithm of the reciprocal of the encoding parameter K is a negative value, and so the encoding parameter K can be interpreted as a parameter corresponding to the Rice parameter expanded to negative integer values. That is, it is possible to estimate the optimum parameter K for codes of the present invention assigned to a sequence of non-negative integer values by estimating optimum Rice parameters for the sequence of non-negative integer values.

The relationship between an integer value and a code corresponding to the integer value in the code tree of the present invention used for the encoding apparatus 100 and the decoding apparatus 150 of the first embodiment and the rule for using a plurality of code trees are designed by taking into account the fact that a code corresponding to the non-negative integer value x_n is not only assumed to be K×x_n bits or (K×x_n+1) bits but also assumed to be a decodable code. More specifically, a constraint is provided such that '1' which is a 1-bit code is assigned to a nm of a predetermined number of integer values 0 of 2 to $2^{K-1}$, and a code, at least 1-bit bit value '1' of which is included in the first K bits and subsequent bit values are '0' is assigned to a run of 0 to a predetermined maximum of ($2^{K-1}$–1) integer values 0 and subsequent one non-negative integer value x_n≠0. The provision of this constraint makes it possible to, when the decoding apparatus 150 reads an integer code corresponding to an integer sequence including a plurality of integer values, know that a boundary between a certain code in the integer code and the immediately following code is included in the portion containing a bit value '1' among K bits. Note that in order to satisfy the aforementioned constraint, the number of bits of a code corresponding to a run of 0 to a predetermined maximum of ($2^{K-1}$–1) integer values 0 and one subsequent non-negative integer value x_n is not only K×x_n bits but K×x_n bits or (K×x_n+1) bits.

Second Embodiment

Although a mode of the present invention has been described in the first embodiment in which encoding and decoding of the present invention are implemented using a predetermined code tree, it is also possible to implement an encoding process and a decoding process equivalent to those of the first embodiment using a predetermined correspondence table instead of a predetermined code tree. This mode using a predetermined correspondence table will be described as a second embodiment.

<<Encoding Apparatus>>

A processing procedure for an encoding method executed by an encoding apparatus 200 of the second embodiment will be described with reference to FIG. 2 and FIG. 3. As shown in FIG. 2, the encoding apparatus 200 of the second embodiment includes an integer encoding part 210 as in the case of the encoding apparatus 100 of the first embodiment. The encoding method of the second embodiment is implemented by the encoding apparatus 200 of the second embodiment executing processes in respective steps shown in FIG. 3 as in the case of the encoding apparatus 100 of the first embodiment.

A sequence of non-negative integer values are inputted to the encoding apparatus 200 of the second embodiment as in the case of the first embodiment. The encoding apparatus 200 of the second embodiment variable-length encodes a sequence of non-negative integer values according to a predetermined correspondence table and thereby implements an encoding process resulting in a shorter bit length than in Golomb-Rice encoding on a sequence of non-negative integer values with a distribution more heavily biased than a Laplacian distribution. In the following description, non-negative integer values inputted to the encoding apparatus 200 will be simply referred to as "integer values."

[Integer Encoding Part 210]

An integer sequence x_1, x_2, . . . , x_N of the sequence of integer values inputted to the encoding apparatus 200 by N samples at a time is inputted to the integer encoding part 210. The integer encoding part 210 of the second embodiment encodes the inputted integer sequence x_1, x_2, . . . , x_N based on the correspondence table created in advance in association with the encoding parameter K which is a natural number equal to or larger than 2 and stored in the integer encoding part 210, thereby obtains a code and outputs the obtained code as an integer code (S210).

[[Correspondence Table Used for Encoding Process]]

The correspondence table stored in advance stores a rule of a correspondence relationship between a partial sequence of integer values by a combination of a run of zero values (a sequence of 0 or more zero values) and one non-zero value, and a code corresponding to the partial sequence. Examples of the correspondence table when K=2 and K=3 are shown in FIG. 9 (A, B) and FIG. 10 (A, B, C and D) respectively. The rule stored in the correspondence table is such a rule that a 1-bit code whose bit value is '1' is assigned to a partial sequence of a run of $2^{K-1}$ zero values, and for other partial sequences, that is, a partial sequence of a run of 0 to ($2^{K-1}$−1) zero values and one subsequent non-zero value x_n, a code of K×x_n bits or (K×x_n+1) bits is assigned to a combination of a run of the respective zero values and non-zero value x.

According to the rule illustrated in the correspondence table, at least one-bit '1' exists within initial K bits in a partial sequence of a run of 0 to ($2^{K-1}$−1) zero values and one subsequent non-zero value x_n respectively and codes of '0' are assigned to all the remaining K×(x_n−1) bits or (K×(x_n−1)+1) bits. More specifically, according to this rule, in the partial sequence of a run of 0 to ($2^{K-1}$−1) zero values and one non-zero value, a code of (K×x_n+1) bits whose bit value of the first bit is '1', bit values from the second bit to the K-th bit are all '0' and bit values of the (K+1)-th bit to (K×x_n+1)-th bit are all '0', or a code of (K×x_n) bits whose bit value of the first bit is '0' and at least 1 bit of (K−1) bits from the second bit to K-th bit is '1' and bit values of the (K+1)-th bit to the (K×x_n)-th bit are all '0' are assigned. Further specifically, according to this rule, $2^{K-1}$ partial codes consisting of one partial code from the first bit to the (K+1)-th bit, bit values of the first bit of the code of (K×x_n+1)-th bit is '1' and the second bit to the (K+1)-th bit are '0' and ($2^{K-1}$−1) partial codes from the first bit to K-th bit, the bit value of the first bit of the code of the (K×x_n) bits is '0' and at least 1 bit of (K−1) bits from the second bit to the K-th bit is '1' and a run of $2^{K-1}$ zero values from 0 to ($2^{K-1}$−1) form a one-to-one correspondence.

[[Encoding Process Using Correspondence Table]]

Using the aforementioned correspondence table, the integer encoding part 210 obtains a code by encoding the respective integer values included in the inputted integer sequence x_1, x_2, . . . , x_N in predetermined order and outputs the obtained code as an integer code. For example, when the predetermined order is order of sample numbers in the sequence, the encoding procedure performed by the integer encoding part 210 is as follows.

(Encoding Procedure)
1. The sample number n is assumed to be 1.
2. Steps (i) and (ii) below are repeated until n=N.
 (i) When non-zero values are found among $2^{K-1}$ integer values from x_n onward, a code corresponding to a partial sequence from x_n until a first non-zero value is obtained from the code table and n plus the number of samples from x_n until the first non-zero value is assumed to be a new n.
 (ii) When all $2^{K-1}$ integer values from x_n are zero values, a code corresponding to a partial sequence of $2^{K-1}$ integer values from x_n is obtained from the code table and n plus $2^{K-1}$ is assumed to be a new n.
3. A code '1' (terminating code) is added to the end of the code obtained in 2.
4. The code obtained in 3 is outputted as an integer code.

Note that the process of adding a terminating code (3 of the encoding procedure) needs not be performed depending on how an integer code is transmitted from the encoding apparatus 200 to a decoding apparatus 250 as in the case of the first embodiment.

Note that the codes obtained through the encoding process using FIG. 9 (A, B) and FIG. 10 (A, B, C, D) in the integer encoding part 210 of the encoding apparatus 200 of the second embodiment coincide with the codes obtained when the code tree used first in the encoding process using the code trees in FIG. 4 and FIG. 5 in the integer encoding part 110 of the encoding apparatus 100 of the first embodiment is assumed to be T(1). When the integer encoding part 210 of the encoding apparatus 200 of the second embodiment performs encoding using FIG. 9 (A, B) and FIG. 10 (A, B, C, D), if the integer encoding part 210 performs encoding after adding ($2^{K-1}$) zero values to the beginning of the inputted integer sequence x_1, x_2, . . . , x_N and removes code '1' at the beginning of the obtained integer code, the code coincides with the code obtained when the code tree used first is assumed to be T(0) in the encoding processes using the respective code trees in FIG. 4 and FIG. 5 in the integer encoding part 110 of the encoding apparatus 100 of the first embodiment. In this way, the encoding process using the correspondence table in the integer encoding part 210 of the encoding apparatus 200 of the second embodiment is equivalent to the encoding process using the code tree in the integer encoding part 110 of the encoding apparatus 100 of the first embodiment.

<<Decoding Apparatus>>

A processing procedure for the decoding method executed by the decoding apparatus 250 of the second embodiment will be described with reference to FIG. 7 and FIG. 8. The decoding apparatus 250 of the second embodiment includes an integer decoding part 260 as in the case of the decoding apparatus 150 of the first embodiment as shown in FIG. 7. The decoding method of the second embodiment is implemented by the decoding apparatus 250 of the second embodiment executing the processes in the respective steps shown in FIG. 8 as in the case of the decoding apparatus 150 of the first embodiment.

An integer code outputted by the encoding apparatus 200 of the second embodiment is inputted to the decoding apparatus 250 of the second embodiment as in the case of the decoding apparatus 150 of the first embodiment. The decoding apparatus 250 of the second embodiment decodes the inputted integer code according to the correspondence table stored in the integer encoding part 210 of the encoding apparatus 200 of the second embodiment and through a decoding process using the correspondence table, obtains a sequence of non-negative integer values and thereby reconstruct the sequence of non-negative integer values inputted to the encoding apparatus 200 of the second embodiment. In the following description, non-negative integer values will be simply referred to as "integer values" as in the case of the aforementioned encoding apparatus.

[Integer Decoding Part 260]

An integer code inputted to the decoding apparatus 250 is inputted to the integer decoding part 260. The integer decoding part 260 decodes the inputted integer code based on the correspondence table created in advance and stored in the integer decoding part 260 which is created in advance to correspond to the encoding parameter K and which is the same correspondence table as that stored in advance in the integer encoding part 210 of the encoding apparatus 200 and used in the integer encoding part 210, obtains and outputs the integer sequence x_1, x_2, . . . , x_N (S260).

More specifically, the integer decoding part 260 repeats a process of reading the code part yet to be read of the inputted integer code from the beginning to the portion where the code corresponding to the correspondence table is found and obtaining the partial sequence of integers corresponding to the read code from the correspondence table from the beginning to the end of the inputted integer code and outputs a sequence that puts together partial sequences of integers thereby obtained as an integer sequence x_1, x_2, . . . , x_N. Through this decoding process, it is possible to obtain the same integer sequence x_1, x_2, . . . , x_N as that in the case where the code tree used first is assumed to be T(1) in the decoding process using the respective code trees in FIG. 4 and FIG. 5 in the integer decoding part 160 of the decoding apparatus 150 of the first embodiment.

Note that when the integer encoding part 210 of the encoding apparatus 200 performs a process of adding ($2^{K-1}-1$) zero values to the beginning of the inputted integer sequence x_1, x_2, . . . , x_N and then performing encoding and removing the code '1' at the beginning of the obtained integer code, the integer decoding part 260 may add the code '1' to the beginning of the inputted integer code, obtain each partial sequence through the aforementioned decoding process based on the above-described correspondence table, omit the ($2^{K-1}-1$) zero values first obtained and output the integer sequence x_1, x_2, . . . , x_N that puts together the partial sequences. Through this decoding process, it is possible to obtain the same integer sequence x_1, x_2, . . . , x_N as that in the case where the code tree used first is assumed to be T(0) in the decoding process using the respective code trees in FIG. 4 and FIG. 5 in the integer decoding part 160 of the decoding apparatus 150 of the first embodiment. Thus, the decoding process using the correspondence table in the integer decoding part 260 of the decoding apparatus 250 in the second embodiment is equivalent to the decoding process using the code tree in the integer decoding part 160 of the decoding apparatus 150 of the first embodiment.

As is seen from above, the decoding apparatus 250 of the second embodiment may decode an integer code obtained through an encoding process using a code tree by the encoding apparatus 100 of the first embodiment through a decoding process using a correspondence table corresponding to the encoding process and obtain an integer sequence x_1, x_2, . . . , x_N, or the decoding apparatus 150 of the first embodiment may decode the integer code obtained through an encoding process using a correspondence table by the encoding apparatus 200 of the second embodiment through a decoding process using the code tree corresponding to the encoding process and obtain an integer sequence x_1, x_2, . . . , x_N.

Third Embodiment

The first embodiment and the second embodiment have described a mode in which encoding and decoding of the present invention are implemented from the procedural standpoint of encoding and decoding using a predetermined code tree or a predetermined correspondence table. A third embodiment will describe a mode of implementing encoding and decoding of the present invention from a data-related standpoint of a code or a sequence of integer values obtained in these procedures.

<<Encoding Apparatus>>

A processing procedure for an encoding method executed by an encoding apparatus 300 of a third embodiment will be described with reference to FIG. 2 and FIG. 3. As shown in FIG. 2, the encoding apparatus 300 of the third embodiment includes an integer encoding part 310 as in the case of the encoding apparatus 100 or the encoding apparatus 200. The encoding method of the third embodiment is implemented by the encoding apparatus 300 of the third embodiment executing the processes in the respective steps shown in FIG. 3 as in the case of the encoding apparatus 100 or the encoding apparatus 200.

As in the case of the encoding apparatus 100 and the encoding apparatus 200, a sequence of non-negative integer values (hereinafter referred to as an "integer sequence") is inputted to the encoding apparatus 300 of the third embodiment. In the following description, non-negative integer values inputted to the encoding apparatus 300 will be simply referred to as "integer values."

[Integer Encoding Part 310]

The integer encoding part 310 obtains a 1-bit code (hereinafter referred to as a "code A") as a code corresponding to a run of integer values 0 of length, a predetermined number from 2 to $2^{K-1}$, which is included in the integer sequence and obtains a code of (K×x_n) bits or (K×x_n+1) bits (hereinafter referred to as a "code B") as a code corresponding to a set of a run of integer values 0 of length from 0 to $2^{K-1}$-1 and one non-zero integer value x_n included in the integer sequence (S310). Where, K represents an encoding parameter which is a natural number equal to or larger than 2. Specifically, an integer sequence x_1, x_2, . . . , x_N is encoded by N samples at a time using the code tree described in the first embodiment or the correspondence table described in the second embodiment to obtain the code A or the code B. Here, when the number of 0s included in the run of integer values 0 corresponding to the code A is assumed to be L ($2 \leq L \leq 2^{K-1}$), the code B obtained in S310 is a code of (K×x_n) bits or (K×x_n+1) bits corresponding to 0 to L−1 integer values 0, that is, a run of a predetermined maximum of $2^{K-1}-1$ integer values and subsequent one non-zero integer value x_n.

Furthermore, it is assumed here that a bit value "x" is a bit value "1", a bit value "y" is a bit value "0", the code A is a 1-bit code, a bit value of which is "x," (see FIG. 9B and FIG. 10D), and the code B includes at least 1 bit value "x" and at least 1 bit value "y" from the first bit to the K-th bit, and the bit values of K×(x_n−1) bits from the last are "y" (see FIG. 9A and FIG. 9B, FIG. 10A to FIG. 10D). Note that as mentioned above, the bit value "x" may be a bit value "0" and the bit value "y" may be a bit value "1".

Furthermore, regarding the code B, more specifically, $2^{K-1}$ runs of integer values 0 of length from 0 to $2^{K-1}-1$ in the integer sequence and the following $2^{K-1}$ partial codes have a one-to-one correspondence.

(Partial code of code B)

(1) When the code B has (K×x_n+1) bits, one partial code comprising (K+1) bits from a first bit to a (K+1)-th bit of the code B, a bit value of the first bit of which is "x" and bit values of a second bit to the (K+1)-th bit of which are "y", (2) When the code B has (K×x_n) bits, ($2^{K-1}-1$) partial codes comprising K bits from the first bit to the K-th bit of the code B, a bit value of the first bit of which is "y"

and a bit value of at least 1 bit of (K−1) bits from the second bit to the K-th bit of which is "x"

<<Decoding Apparatus>>

A processing procedure for the decoding method executed by a decoding apparatus 350 of the third embodiment will be described with reference to FIG. 7 and FIG. 8. As shown in FIG. 7, the decoding apparatus 350 of the third embodiment includes an integer decoding part 360 as in the case of the decoding apparatus 150 or the decoding apparatus 250. The decoding method of the third embodiment is implemented by the decoding apparatus 350 of the third embodiment executing the processes in the respective steps shown in FIG. 8 as in the case of the decoding apparatus 150 or the decoding apparatus 250.

As in the case of the decoding apparatus 150 or the decoding apparatus 250, a code string outputted by the encoding apparatus 300 of the third embodiment is inputted to the decoding apparatus 350 of the third embodiment. In the following description, non-negative integer values will be simply referred to as "integer values" as in the case of the description of the aforementioned encoding apparatus.

[Integer Decoding Part 360]

The integer decoding part 360 obtains a nm of integer values 0 of length, a predetermined number from 2 to $2^{K-1}$, from a 1-bit code (hereinafter referred to as a "code A") included in the inputted code string and obtains a set of a run of integer values 0 of length from 0 to $2^{K-1}-1$ and one non-zero integer value x_n from the code of (K×x_n) bits or (K×x_n+1) bits (hereinafter referred to as a "code B") included in the inputted code string (S360). Where, K represents an encoding parameter which is a natural number equal to or larger than 2. Specifically, a code included in the inputted code string is decoded using the code tree described in the first embodiment and the correspondence table described in the second embodiment to obtain the sequence of integer values corresponding to the code A or the code B. Assuming here that the number of 0s included in the run of integer values 0 obtained from the code A is L ($2 ≤ L ≤ 2^{K-1}$), the number of 0s included in the run of integer values 0 obtained from the code B in S360 is 0 to L−1.

Assuming here that the bit value "x" is a bit value "1", the bit value "y" is a bit value "0", the code A is a 1-bit code, a bit value of which is "x" (see FIG. 9B, FIG. 10D), and the code B includes at least 1 bit value "x" and at least 1 bit value "y" from the first bit to the K-th bit and the bit values of the K×(x_n−1) bits from the last are "y" (see FIG. 9A and FIG. 9B, FIG. 10A to FIG. 10D). Note that the bit value "x" may be a bit value "0" and the bit value "y" may be bit value "1" as in the case of the encoding apparatus 300.

The integer decoding part 360 performs the following two processes and can thereby identify the code A and the code B included in the inputted code string. Specifically, the integer decoding part 360 reads in order from the beginning of the inputted code string, the inputted code string by a run of K bits (hereinafter referred to as a "K-bit string") at a time and identifies, when the read K-bit string includes "y," that a bit immediately before the K-bit string including the "y" is a termination bit of the code A or the code B.

Furthermore, regarding the code B, more specifically, the following $2^{K-1}$ partial codes and $2^{K-1}$ runs of integer values 0 of length from 0 to $2^{K-1}-1$ in the sequence of integer values obtained by the integer decoding part 360 have a one-to-one correspondence.

(Partial Code of Code B)

(1) When the code B has (K×x_n+1) bits, one partial code comprising (K+1) bits from a first bit to a (K+1)-th bit of the code B, a bit value of the first bit of which is "x" and bit values of a second bit to the (K+1)-th bit of which are "y"

(2) When the code B has (K×x_n) bits, ($2^{K-1}-1$) partial codes comprising K bits from the first bit to a K-th bit of the code B, a bit value of the first bit of which is "y" and a bit value of at least 1 bit of (K−1) bits from the second bit to the K-th bit of which is "x"

<<Data Structure of Code String>>

A data structure of a code string handled by the encoding apparatus and the decoding apparatus of the third embodiment, that is, a data structure of a code string which is a code string obtained by the encoding apparatuses of the first embodiment and the second embodiment from a sequence of integer values, used by the decoding apparatuses of the first embodiment and the second embodiment to obtain a sequence of integer values will be described.

[Data Structure of Code String]

A code string of a sequence of non-negative integer values (hereinafter referred to as an "integer sequence") is used by the encoding apparatus to obtain a code string from the integer sequence or by the decoding apparatus to obtain an integer sequence from a code string.

The data structure of the code string includes a 1-bit code (hereinafter referred to as a "code A") which is a code corresponding to a run of integer values 0 of length, a predetermined number from 2 to $2^{K-1}$, which is included in the integer sequence and a (K×x_n)-bit or (K×x_n+1)-bit code (hereinafter referred to as a "code B") which is a code corresponding to a set of a run of integer values 0 of length from 0 to $2^{K-1}-1$ and one non-zero integer value x_n included in the integer sequence, where K represents an encoding parameter, which is a natural number equal to or larger than 2. Assuming here that the number of 0s included in the run of integer values 0 corresponding to the code A is L ($2 ≤ L ≤ 2^{K-1}$), the code B is a code of (K×x_n) bits or (K×x_n+1) bits corresponding to 0 to L−1 integer values 0, that is, a run of a predetermined maximum of $2^{K-1}-1$ integer values and subsequent one non-zero integer value x_n.

Here, assuming that the bit value "x" is a bit value "1" and the bit value "y" is a bit value "0", the code A is a 1-bit code, a bit value of which is "x" (see FIG. 9B, FIG. 10D), and the code B includes at least 1 bit value "x" and at least 1 bit value "y" form the first bit to the K-th bit, and the bit values of the K×(x_n−1) bits from the last are "y" (see FIG. 9A and FIG. 9B, FIG. 10A to FIG. 10D). Note that as mentioned above, the bit value "x" may be bit value "0" and the bit value "y" may be bit value "1."

Furthermore, regarding the code B, more specifically, $2^{K-1}$ runs of integer values 0 of length from 0 to $2^{K-1}-1$ in the integer sequence and the following $2^{K-1}$ partial codes have a one-to-one correspondence.

(Partial Code of Code B)

(1) When the code B has (K×x_n+1) bits, one partial code comprising (K+1) bits from a first bit to a (K+1)-th bit of the code B, a bit value of the first bit of which is "x" and bit values of a second bit to the (K+1)-th bit of which are "y"

(2) When the code B has (K×x_n) bits, ($2^{K-1}-1$) partial codes comprising K bits from the first bit to the K-th bit of the code B, a bit value of the first bit of which is "y" and a bit value of at least 1 bit of (K−1) bits from the second bit to the K-th bit of which is "x"

According to the invention of the present embodiment, it is possible to encode even a sequence of integer values containing small non-zero values and heavily biased toward small values or a sequence of integer values biased to an extent that the technique of Non-Patent Literature 2 cannot cover with a small average number of bits. Furthermore, such a code can be decoded.

Fourth Embodiment

As described above, the logarithm of a reciprocal of an encoding parameter K used for a code of the present invention corresponds to a Rice parameter of a Golomb-Rice code and the code of the present invention can also be interpreted as a Golomb-Rice code corresponding to a Rice parameter having a negative value. Therefore, it is possible to obtain an optimum encoding parameter K for a partial sequence of an inputted sequence of integer values based on a conventional optimum Rice parameter estimation method and encode the inputted sequence of integer values by combining the process of the integer encoding part of the first embodiment to the third embodiment using the obtained encoding parameter K with Golomb-Rice encoding, and perform decoding corresponding to this encoding. This mode will be described as a fourth embodiment.

<<Encoding Apparatus>>

Figure 11:
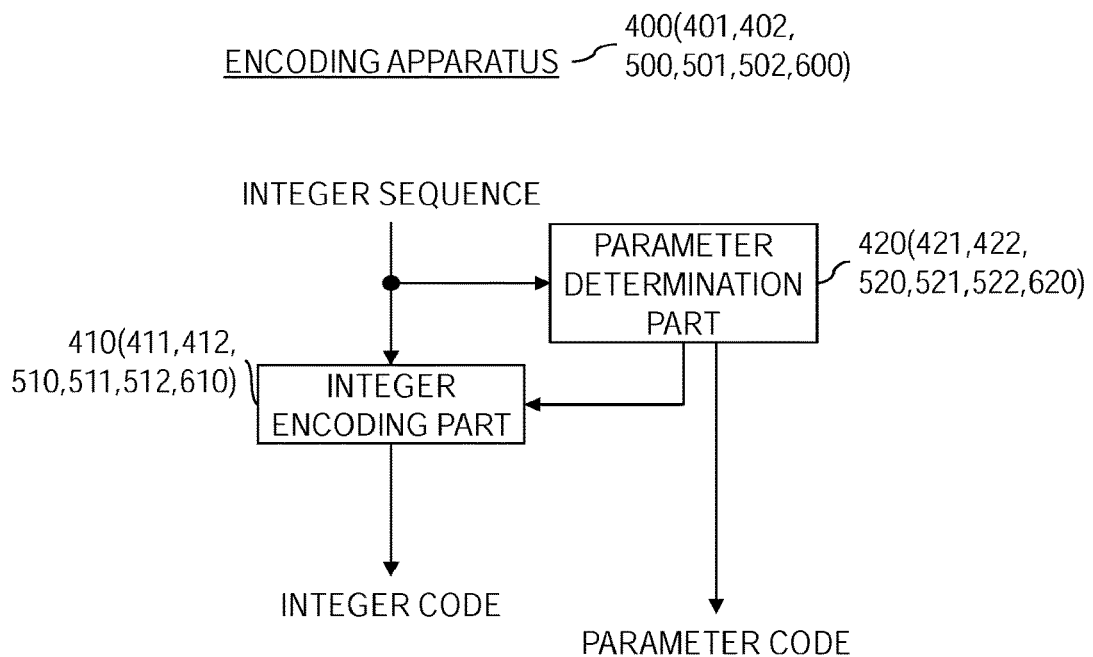
FIG. 11 is a block diagram illustrating an example of a configuration of an encoding apparatus 400 (401, 402, 500, 501, 502, 600)
Figure 12:
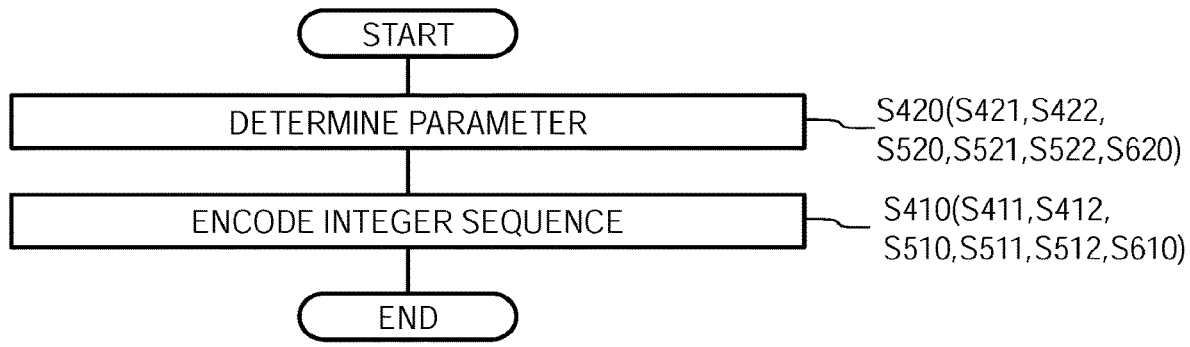
FIG. 12 is a flowchart illustrating an example of operation of the encoding apparatus 400 (401, 402, 500, 501, 502, 600)

A processing procedure for an encoding method executed by an encoding apparatus 400 of the fourth embodiment will be described with reference to FIG. 11 and FIG. 12. As shown in FIG. 11, the encoding apparatus 400 of the fourth embodiment includes a parameter determination part 420 and an integer encoding part 410. The encoding method of the fourth embodiment is implemented by the encoding apparatus 400 of the fourth embodiment executing processes in respective steps shown in FIG. 12.

A sequence of non-negative integer values is inputted to the encoding apparatus 400 of the fourth embodiment as in the case of the first to third embodiments. The sequence of non-negative integer values inputted to the encoding apparatus 400 of the fourth embodiment is inputted to the parameter determination part 420 and the integer encoding part 410 by N samples at a time. That is, the encoding apparatus 400 of the fourth embodiment encodes a sequence of integer values such as a sequence of absolute values of integer values obtained by transforming, for example, voice collected using a microphone, music or the like into a digital signal and quantizing the digital signal for every frame of N samples.

In the following description, non-negative integer values inputted to the encoding apparatus of the present embodiment will be simply referred to as "integer values."

[Parameter Determination Part 420]

An integer sequence x_1, x_2, . . . , x_N of the sequence of integer values inputted to the encoding apparatus 400 by N samples at a time is inputted to the parameter determination part 420. Based on the inputted integer sequence x_1, x_2, . . . , x_N, the parameter determination part 420 obtains and outputs a Rice parameter r corresponding to the integer sequence and a parameter code which is a code representing the parameter (S420). The parameter code may be obtained by encoding a Rice parameter so that the decoding apparatus 450 decodes the parameter code to thereby obtain the Rice parameter r determined by the parameter determination part 420.

The parameter determination part 420 obtains the Rice parameter r according to equation (5) using, for example, each integer value included in the inputted integer sequence x_1, x_2, . . . , x_N.

[Formula 5]

$$r = \log_2\left(\frac{\ln 2}{N}\sum_{n=1}^{N} x\_n\right) \quad (5)$$

The Rice parameter r determined in equation (5) minimizes an estimate value of a total bit length at the time of Golomb-Rice encoding estimated from equation (2) for the integer sequence x_1, x_2, . . . , x_N.

The parameter determination part 420 then scalar quantizes the Rice parameter r obtained according to, for example, equation (5), obtains a code, outputs the obtained code as a parameter code and outputs the quantized value of the Rice parameter r corresponding to the parameter code as the Rice parameter r.

[Integer Encoding Part 410]

An integer sequence x_1, x_2, . . . , x_N of the sequence of integer values inputted to the encoding apparatus 400 by N samples at a time and the Rice parameter r outputted by the parameter determination part 420 are inputted to the integer encoding part 410. When the Rice parameter r is a non-negative value, after rounding off the Rice parameter r to an integer value, for example, by rounding off the first decimal place of the Rice parameter r, the integer encoding part 410 performs Golomb-Rice encoding using the Rice parameter r which is an integer value on the integer sequence x_1, x_2, . . . , x_N, outputs the code obtained through Golomb-Rice encoding as an integer code, whereas when the Rice parameter r is a negative value, the integer encoding part 410 obtains the value of K from the Rice parameter r by applying $K=2^{-r}$, rounds off the value of K to an integer value, for example, by rounding off the first decimal place of the obtained value of K, and obtains and outputs an integer code through the same process as that of any one of the integer encoding parts of the first to third embodiments using the obtained encoding parameter K (S410). Note that when the encoding parameter K is a value between 1 and 2, the integer value after rounding may be set to 2, for example.

<<Decoding Apparatus>>

Figure 13:
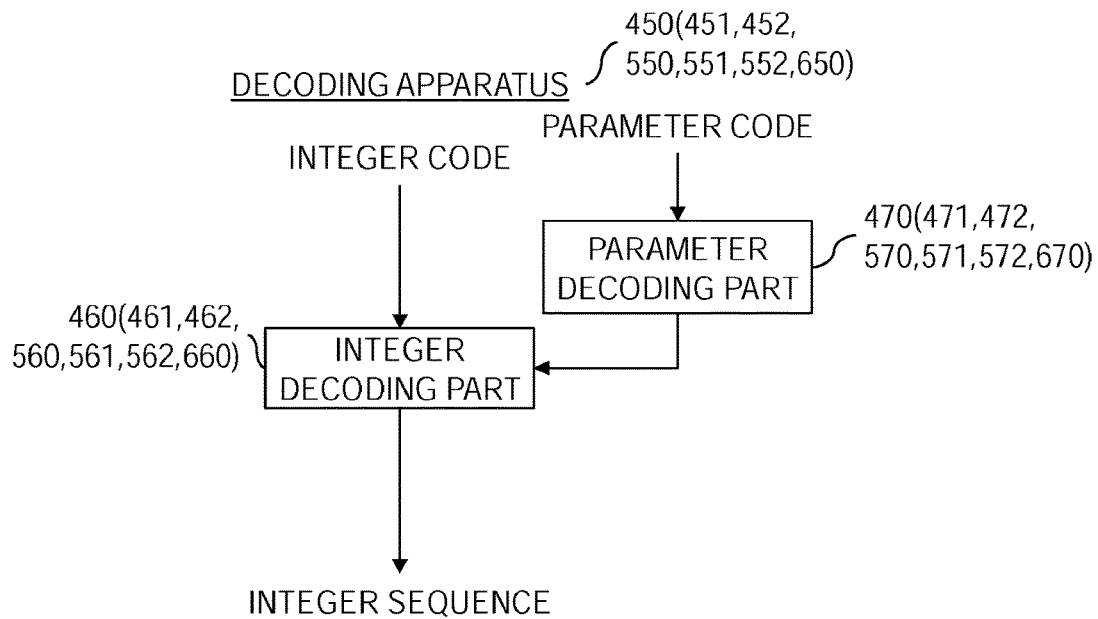
FIG. 13 is a block diagram illustrating an example of a configuration of a decoding apparatus 450 (451, 452, 550, 551, 552, 650)
Figure 14:
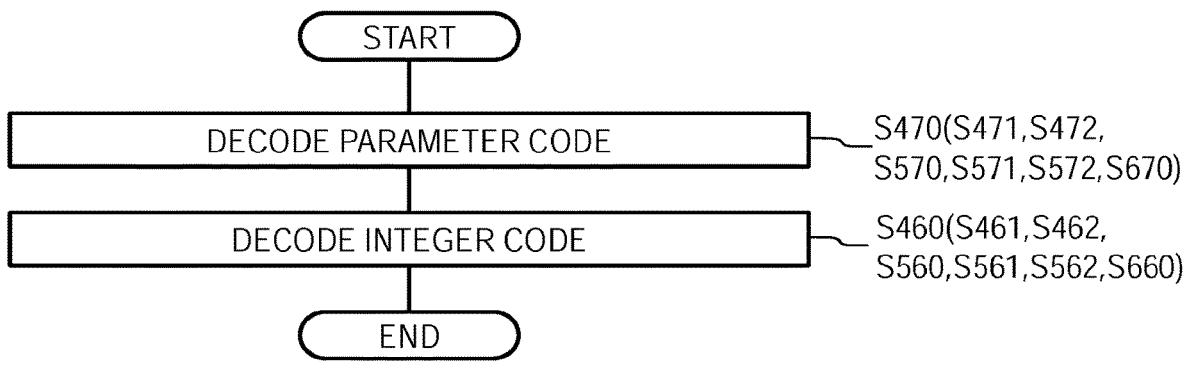
FIG. 14 is a flowchart illustrating an example of operation of the decoding apparatus 450 (451, 452, 550, 551, 552, 650).

A processing procedure of a decoding method executed by a decoding apparatus 450 of the fourth embodiment will be described with reference to FIG. 13 and FIG. 14. The decoding apparatus 450 of the fourth embodiment includes a parameter decoding part 470 and an integer decoding part 460 as shown in FIG. 13. The decoding method of the fourth embodiment is implemented by the decoding apparatus 450 of the fourth embodiment executing processes in respective steps shown in FIG. 14.

An integer code outputted by the encoding apparatus 400 of the fourth embodiment and a parameter code are inputted to the decoding apparatus 450 of the fourth embodiment. The integer code and the parameter code inputted to the decoding apparatus 450 are inputted to the parameter decoding part 470 and the integer decoding part 460 for each code corresponding to N samples of the sequence of integer values, that is, the decoding apparatus 450 performs a decoding process in the same frame as the encoding apparatus 400.

[Parameter Decoding Part 470]

The parameter code inputted to the decoding apparatus 450 is inputted to the parameter decoding part 470. The parameter decoding part 470 decodes the parameter code through a decoding process corresponding to the process whereby the parameter determination part 420 has obtained the parameter code, obtains and outputs the Rice parameter r (S470). Through, for example, the decoding process corresponding to scalar quantization carried out by the parameter determination part 420 of the encoding apparatus 400, the parameter decoding part 470 obtains and outputs the quantized value of the Rice parameter r corresponding to the parameter code as the Rice parameter r.

[Integer Decoding Part 460]

The integer code inputted to the decoding apparatus 450 and the Rice parameter r outputted by the parameter decoding part 470 are inputted to the integer decoding part 460. When the Rice parameter r is a non-negative value, after rounding off the Rice parameter r to an integer value using the same method executed by the integer encoding part 410 of the encoding apparatus 400, the integer decoding part 460 performs Golomb-Rice decoding on the integer code using the Rice parameter r, obtains and outputs an integer sequence x_1, x_2, . . . , x_N, whereas when the Rice parameter r is a negative value, the integer decoding part 460 obtains an encoding parameter K by transforming the Rice parameter r through the same process as that of the integer encoding part 410 of the fourth embodiment, that is, obtains the value of K from the Rice parameter r by applying $K=2^{-r}$, rounds off the value of K into an integer value using the same method as that executed by the integer encoding part 410 of the encoding apparatus 400, thereby obtains the encoding parameter K, and obtains and outputs an integer sequence x_1, x_2, . . . , x_N through the same process as that of any one of the integer decoding parts of the first to third embodiments using the obtained encoding parameter K (S460).

<Modification 1 of Fourth Embodiment>

An encoding/decoding process combining Golomb-Rice encoding and decoding has been performed in the fourth embodiment, but Golomb-Rice encoding and decoding need not be combined. A mode in which Golomb-Rice encoding and decoding are not combined will be described as modification 1 of the fourth embodiment. Operations of the parameter determination part 421 of the encoding apparatus 401 and the parameter decoding part 471 of the decoding apparatus 451 are the same as the operation of the fourth embodiment, whereas operations of the integer encoding part 411 of the encoding apparatus 401 and the integer decoding part 461 of the decoding apparatus 451 are different from the operation of the fourth embodiment.

[Integer Encoding Part 411]

An integer sequence x_1, x_2, . . . , x_N of the sequence of integer values inputted to the encoding apparatus 401 by N samples at a time and the Rice parameter r outputted by the parameter determination part 421 are inputted to the integer encoding part 411. When the Rice parameter r is a non-negative value, the integer encoding part 411 uses 2 as an encoding parameter K, obtains and outputs an integer code through the same process as that of any one of the integer encoding parts of the first to third embodiments, whereas when the Rice parameter r is a negative value, the integer encoding part 411 obtains the value of K from the Rice parameter r by applying $K=2^{-r}$, rounds off the value of K to an integer value, for example, by rounding off the first decimal place of the obtained value of K, thereby obtains an encoding parameter K, obtains and outputs an integer code through the same process as that of any one of the integer encoding parts of the first to third embodiments using the obtained encoding parameter K (S411). Note that when the encoding parameter K is between 1 and 2, the integer value after rounding may be set to 2, for example.

[Integer Decoding Part 461]

The integer code inputted to the decoding apparatus 451 and Rice parameter r outputted by the parameter decoding part 471 are inputted to the integer decoding part 461. When the Rice parameter r is a non-negative value, the integer decoding part 461 uses 2 as an encoding parameter K, obtains and outputs an integer sequence x_1, x_2, . . . , x_N through the same process as that of any one of the integer decoding parts of the first to third embodiments, whereas when the Rice parameter r is a negative value, the integer decoding part 461 converts the Rice parameter r to an encoding parameter K through the same process as that of the integer encoding part 410 of the fourth embodiment, that is, obtains the value of K from the Rice parameter r by applying $K=2^{-r}$, rounds off the value of K to an integer value using the same method as that performed by the integer encoding part 411 of the encoding apparatus 401, thereby obtains the encoding parameter K, obtains and outputs an integer sequence x_1, x_2, . . . , x_N through the same process as that of any one of the integer decoding parts of the first to third embodiments using the obtained encoding parameter K (S461).

<Modification 2 of Fourth Embodiment>

In the fourth embodiment, the integer encoding part 410 is configured to obtain the encoding parameter K from the Rice parameter r when the Rice parameter r is a negative value, whereas when the Rice parameter r is a negative value, the parameter determination part 420 may be configured to directly obtain the encoding parameter K from the integer sequence. Assuming this mode as modification 2 of the fourth embodiment, differences from the fourth embodiment will be described.

[Parameter Determination Part 422]

The parameter determination part 420 of the fourth embodiment is configured to always output a Rice parameter and a parameter code corresponding to the Rice parameter irrespective of the value of the Rice parameter, whereas when the Rice parameter r is a non-negative value, the parameter determination part 422 of modification 2 of the fourth embodiment is configured to output the Rice parameter r and the parameter code corresponding to the Rice parameter r, and obtain, when the Rice parameter r is a negative value, the encoding parameter K from the integer sequence according to equation (6), which will be described later, and output the encoding parameter K and the parameter code corresponding to the encoding parameter K (S422). In that case, the parameter code may be such a code that the corresponding decoding apparatus 452 can uniquely identify the value of the Rice parameter r and the value of the encoding parameter K. For example, a code obtained by adding a 1-bit code '1' before a code obtained by encoding the Rice parameter r is assumed to be a parameter code and a code obtained by adding a 1-bit code '0' before a code obtained by encoding the encoding parameter K is assumed to be a parameter code so that the same code may not be included in a code group of parameter codes to be assigned to the Rice parameter r and a code group of codes to be assigned to the encoding parameter K.

[Integer Encoding Part 412]

An integer sequence x_1, x_2, . . . , x_N of the sequence of integer values inputted to the encoding apparatus 402 by N samples at a time and the Rice parameter r or the encoding parameter K outputted by the parameter determination part 422 are inputted to the integer encoding part 412. When the Rice parameter r is inputted, the integer encoding part 412 rounds off the Rice parameter r into an integer value, performs Golomb-Rice encoding with the Rice parameter r which is an integer value on the integer sequence x_1, x_2, ..., x_N, assumes the code obtained through Golomb-Rice encoding as an integer code and outputs the integer code, whereas when the encoding parameter K is inputted, the integer encoding part 412 rounds off the encoding parameter K into an integer value, and obtains and outputs an integer code through the same process as any one of the integer encoding parts of the first to third embodiments using the encoding parameter K which is an integer value (S412). Note that when the encoding parameter K is a value between 1 and 2, the integer value after rounding may be set to 2, for example.

[Parameter Decoding Part 472]

The parameter decoding part 470 of the fourth embodiment is configured to decode a parameter code and obtain a Rice parameter, whereas the parameter decoding part 472 of modification 2 of the fourth embodiment is configured to decode a parameter code, and obtain and output a Rice parameter r or an encoding parameter K (S472).

[Integer Decoding Part 462]

The integer code inputted to the decoding apparatus 452 and the Rice parameter r or the encoding parameter K outputted by the parameter decoding part 472 are inputted to the integer decoding part 462. When the Rice parameter r is inputted, the integer decoding part 462 rounds off the Rice parameter r into an integer value using the same method executed by the integer encoding part 412 of the encoding apparatus 402, then performs Golomb-Rice decoding using a Rice parameter r which is an integer value on the integer code, and obtains and outputs an integer sequence x_1, x_2, ..., x_N, whereas when the encoding parameter K is inputted, the integer decoding part 462 rounds off the encoding parameter K into an integer value using the same method as that executed by the integer encoding part 412 of the encoding apparatus 402, then obtains and outputs an integer sequence x_1, x_2, ..., x_N through the same process as that of any one of the integer decoding parts of the first to third embodiments using the encoding parameter K which is an integer value (S462).

Fifth Embodiment

Although the encoding apparatus of the fourth embodiment first obtains the Rice parameter r and obtains the encoding parameter K from the obtained Rice parameter r, it is also possible to directly estimate the encoding parameter K from the inputted sequence of integer values by estimating a likely K with respect to a distribution p (x, 1/K) to which the code of the present invention is optimum. In this case, it is possible to interpret that the Golomb-Rice code is a code of the present invention according to K that takes a value equal to or less than 1. Therefore, it is possible to directly obtain the optimum encoding parameter K from a partial sequence of the inputted sequence of integer values and combine the process of the integer encoding part of the first embodiment to the third embodiment using the obtained encoding parameter K with the Golomb-Rice encoding, and encode the inputted sequence of integer values or perform decoding corresponding to the encoding. This mode will be described as a fifth embodiment.

<<Encoding Apparatus>>

A processing procedure for the encoding method executed by an encoding apparatus 500 of the fifth embodiment will be described with reference to FIG. 11 and FIG. 12. As shown in FIG. 11, the encoding apparatus 500 of the fifth embodiment includes a parameter determination part 520 and an integer encoding part 510. The encoding method of the fifth embodiment is implemented by the encoding apparatus 500 of the fifth embodiment executing processes in respective steps shown in FIG. 12.

A sequence of non-negative integer values is inputted to the encoding apparatus 500 of the fifth embodiment as in the cases of the first to fourth embodiments. The sequence of non-negative integer values inputted to the encoding apparatus 500 of the fifth embodiment is inputted to the parameter determination part 520 and the integer encoding part 510 by N samples at a time. That is, the encoding apparatus 500 of the fifth embodiment encodes a sequence of integer values such as a sequence of absolute values of integer values obtained by transforming, for example, voice collected using a microphone, music or the like into a digital signal and quantizing the digital signal for every frame of N samples.

In the following description, non-negative integer values inputted to the encoding apparatus of the present embodiment will be simply referred to as "integer values."

[Parameter Determination Part 520]

An integer sequence x_1, x_2, ..., x_N of the sequence of integer values inputted to the encoding apparatus 500 by N samples at a time is inputted to the parameter determination part 520. Based on the inputted integer sequence x_1, x_2, ..., x_N, the parameter determination part 520 obtains and outputs the encoding parameter K corresponding to the integer sequence thereof and a parameter code which is a code representing the parameter (S520). The parameter code may be obtained by encoding the encoding parameter K so that a decoding apparatus 550 decodes the parameter code to thereby obtain the encoding parameter K determined by the parameter determination part 520.

The parameter determination part 520 obtains the encoding parameter K according to equation (6) using, for example, the respective integer values included in the inputted integer sequence x_1, x_2, ..., x_N. The parameter determination part 520 obtains a log-likelihood of the integer sequence x_1, x_2, ..., x_N with respect to the distribution p (x, 1/K) based on equation (4), and obtains and outputs an encoding parameter K that maximizes the log-likelihood as shown in the following equation.

[Formula 6]

$$K = \log_2\left(1 + \frac{1}{\frac{1}{N}\sum_{n=1}^{N} x\_n}\right) \quad (6)$$

The encoding parameter K obtained in equation (6) maximizes the log-likelihood with respect to the distribution p (x, 1/K) based on equation (4) with respect to the integer sequence x_1, x_2, ..., x_N.

The parameter determination part 520 then scalar quantizes the encoding parameter K obtained, for example, in equation (6), obtains a code and outputs the obtained code as a parameter code and outputs the quantized value of the encoding parameter K corresponding to the parameter code as the encoding parameter K.

[Integer Encoding Part 510]

An integer sequence x_1, x_2, ..., x_N of the sequence of integer values inputted to the encoding apparatus 500 by N samples at a time and the encoding parameter K outputted by the parameter determination part 520 are inputted to the integer encoding part 510. When the encoding parameter K is equal to or less than 1, the integer encoding part 510 obtains the value of r from the encoding parameter K by applying $r=-\log_2 K$, rounds off the value of r into an integer value by rounding off the first decimal place of the obtained value of r, thereby obtains a Rice parameter r, performs Golomb-Rice encoding with the Rice parameter r on the integer sequence x_1, x_2, . . . , x_N using the obtained Rice parameter r, and outputs the code obtained by Golomb-Rice encoding as an integer code, whereas when the encoding parameter K is larger than 1, after rounding off the value of K into an integer value by rounding off the first decimal place of the encoding parameter K, obtains and outputs an integer code through the same process as that of any one of the integer encoding parts of the first to third embodiments using the encoding parameter K which is an integer value (S510). Note that when the encoding parameter K is a value between 1 and 2, for example, the integer value after rounding may be assumed to be 2.

<<Decoding Apparatus>>

A processing procedure for the decoding method executed by the decoding apparatus 550 of the fifth embodiment will be described with reference to FIG. 13 and FIG. 14. As shown in FIG. 13, the decoding apparatus 550 of the fifth embodiment includes a parameter decoding part 570 and an integer decoding part 560. The decoding method of the fifth embodiment is implemented by the decoding apparatus 550 of the fifth embodiment executing the processes in the respective steps shown in FIG. 14.

An integer code outputted by the encoding apparatus 500 of the fifth embodiment and a parameter code are inputted to the decoding apparatus 550 of the fifth embodiment. The integer code and the parameter code inputted to the decoding apparatus 550 are inputted to the parameter decoding part 570 and the integer decoding part 560 for each code corresponding to N samples at a time, of the sequence of integer values. That is, the decoding apparatus 550 performs a decoding process in the same frame as the encoding apparatus 500.

[Parameter Decoding Part 570]

A parameter code inputted to the decoding apparatus 550 is inputted to the parameter decoding part 570. The parameter decoding part 570 decodes a parameter code through a decoding process corresponding to that whereby the parameter determination part 520 obtains the parameter code, obtains and outputs the encoding parameter K (S570). The parameter decoding part 570 obtains and outputs a quantized value of the encoding parameter K corresponding to the parameter code, for example, through a decoding process corresponding to the scalar quantization carried out by the parameter determination part 520 of the encoding apparatus 500 as the ening parameter K.

[Integer Decoding Part 560]

The integer code inputted to the decoding apparatus 550 and the encoding parameter K outputted by the parameter decoding part 570 are inputted to the integer decoding part 560. When the encoding parameter K is equal to or less than 1, the integer decoding part 560 converts the encoding parameter K to a Rice parameter r through the same process as that of the integer encoding part 510 of the fifth embodiment, that is, obtains the value of r from the encoding parameter K by applying $r=-\log_2 K$, rounds off the value of r into an integer value using the same method as that performed by the integer encoding part 510 of the encoding apparatus 500, obtains the Rice parameter r, performs Golomb-Rice decoding using the Rice parameter r on the integer code using the Rice parameter r, obtains and outputs the integer sequence x_1, x_2, . . . , x_N, whereas when the encoding parameter K is larger than 1, the integer decoding part 560 rounds off the encoding parameter K to an integer value using the same method as that performed by the integer encoding part 510 of the encoding apparatus 500, and then obtains and outputs the integer sequence x_1, x_2, . . . , x_N through the same process as that of any one of the integer decoding parts of the first to third embodiments using the encoding parameter K which is an integer value (S560).

<Modification 1 of Fifth Embodiment>

Although encoding and decoding processes are performed in combination with Golomb-Rice encoding and decoding in the fifth embodiment, the encoding and decoding processes need not be combined with Golomb-Rice encoding and decoding. A mode in which the encoding and decoding processes are not combined with Golomb-Rice encoding and decoding will be described as modification 1 of the fifth embodiment. Operations of a parameter determination part 521 of an encoding apparatus 501 and a parameter decoding part 571 of a decoding apparatus 551 are the same as those of the fifth embodiment, whereas operations of an integer encoding part 511 of the encoding apparatus 501 and an integer decoding part 561 of the decoding apparatus 551 are different from those of the fifth embodiment.

[Integer Encoding Part 511]

An integer sequence x_1, x_2, . . . , x_N of the sequence of integer values inputted to the encoding apparatus 501 by N samples at a time and an encoding parameter K outputted by the parameter determination part 521 are inputted to the integer encoding part 511. The integer encoding part 511 rounds off the value of K to an integer value, for example, by rounding off the first decimal place of the inputted encoding parameter K, uses 2 when the encoding parameter K which is an integer value is equal to or less than 1 as the encoding parameter K, obtains and outputs an integer code through the same process as that of any one of the integer encoding parts of the first to third embodiments, whereas when the encoding parameter K which is an integer value is larger than 1, the integer encoding part 511 obtains an outputs an integer code through the same process as that of any one of the integer encoding parts of the first to third embodiments using the encoding parameter K which is an integer value (S511).

[Integer Decoding Part 561]

The integer code inputted to the decoding apparatus 551 and the encoding parameter K outputted by the parameter decoding part 571 are inputted to the integer decoding part 561. The integer decoding part 561 rounds off the encoding parameter K to an integer value using the same method as that performed by the integer encoding part 511 of the encoding apparatus 501, and then uses 2, when the encoding parameter K of the integer value is equal to or less than 1, as the encoding parameter K, obtains and outputs the integer sequence x_1, x_2, . . . , x_N through the same process as that of any one of the integer decoding parts of the first to third embodiments, whereas when the encoding parameter K which is an integer value is larger than 1, the integer decoding part 561 obtains and outputs the integer sequence x_1, x_2, . . . , x_N through the same process as that of any one of the integer decoding parts of the first to third embodiments using the encoding parameter K which is an integer value (S561).

<Modification 2 of Fifth Embodiment>

Although the fifth embodiment adopts a configuration in which when the encoding parameter K is equal to or less than 1, the integer encoding part 510 obtains the Rice parameter r from the encoding parameter K, a configuration may also be adopted in which when the encoding parameter K is equal to or less than 1, the parameter determination part 520 directly obtains the Rice parameter r from the integer sequence. Assuming this mode as modification 2 of the fifth embodiment, differences from the fifth embodiment will be described.

[Parameter Determination Part 522]

The parameter determination part 520 of the fifth embodiment is configured to always output the encoding parameter K and the parameter code corresponding to the encoding parameter K regardless of the value of the encoding parameter K, whereas the parameter determination part 522 of modification 2 of the fifth embodiment outputs the encoding parameter K and the parameter code corresponding to the encoding parameter K when the encoding parameter K is larger than 1, or obtains the Rice parameter r from the integer sequence according to equation (5) and outputs the Rice parameter r and the parameter code corresponding to the Rice parameter r when the encoding parameter K is equal to or less than 1 (S522). In that case, the parameter code may be such a code that a corresponding decoding apparatus 552 can uniquely identify the value of the Rice parameter r and the value of the encoding parameter K as in the case of modification 2 of the fourth embodiment.

[Integer Encoding Part 512]

The integer sequence x_1, x_2, . . . , x_N of the sequence of integer values inputted to the encoding apparatus 502 by N samples at a time and the encoding parameter K or the Rice parameter r outputted by the parameter determination part 522 are inputted to the integer encoding part 512. When the Rice parameter r is inputted, the integer encoding part 512 rounds off the value of the Rice parameter r into an integer value, then performs Golomb-Rice encoding using the Rice parameter r which is an integer value on the integer sequence x_1, x_2, . . . , x_N and outputs the code obtained through Golomb-Rice encoding as an integer code, whereas when the encoding parameter K is inputted, the integer encoding part 512 rounds off the encoding parameter K into an integer value, then obtains and outputs the integer code through the same process as that of any one of the integer encoding parts of the first to third embodiments using the encoding parameter K which is an integer value (S512). Note that when the encoding parameter K is a value between 1 and 2, the integer value after rounding may be set to 2, for example.

[Parameter Decoding Part 572]

Although the parameter decoding part 570 of the fifth embodiment decodes a parameter code and obtains an encoding parameter K, a parameter decoding part 572 of modification 2 of the fifth embodiment decodes a parameter code, and obtains and outputs the encoding parameter K or the Rice parameter r (S572).

[Integer Decoding Part 562]

The integer code inputted to the decoding apparatus 552 and the encoding parameter K or the Rice parameter r outputted by the parameter decoding part 572 are inputted to the integer decoding part 562. When the Rice parameter r is inputted, the integer decoding part 562 rounds off the value of the Rice parameter r into an integer value using the same method as that performed by the integer encoding part 512 of the encoding apparatus 502, performs Golomb-Rice decoding using the Rice parameter r which is an integer value on the integer code, obtains and outputs the integer sequence x_1, x_2, . . . , x_N, whereas when the encoding parameter K is inputted, the integer decoding part 562 rounds off the encoding parameter K into an integer value using the same method as that performed by the integer encoding part 512 of the encoding apparatus 502, and then obtains and outputs the integer sequence x_1, x_2, . . . , x_N through the same process as that of any one of the integer decoding parts of the first to third embodiments using the encoding parameter K which is an integer value (S562).

<Other Modifications of Fourth Embodiment and Fifth Embodiment>

Note that since the Rice parameter r and the encoding parameter K are mutually convertible by applying $K=2^{-r}$ and $r=-\log_2 K$, if the integer encoding part of the encoding apparatus and the integer decoding part of the decoding apparatus are allowed to use the same value of the same parameter, which parameter is to be encoded/decoded and the above conversion may be used in any combination. Furthermore, if the integer encoding part of the encoding apparatus and the integer decoding part of the decoding apparatus are allowed to use the same value of the same parameter, either value of the Rice parameter r or the coding parameter K may be subjected to a rounding process or any value before and after parameter encoding (i.e., before and after quantization) may be subjected to a rounding process or quantization of values in encoding and a rounding process may be performed simultaneously. In short, the description in the fourth embodiment and the fifth embodiment, and modification 1 and modification 2 thereof are merely examples, the encoding process and the decoding process may be performed using the same value of the same parameter in the integer encoding part of the encoding apparatus and the integer decoding part of the decoding apparatus for every frame of N samples.

Sixth Embodiment

A mode has been described in the fourth embodiment and the fifth embodiment in which encoding and decoding of the present invention are implemented by performing encoding and decoding of the first embodiment to the third embodiment using the Rice parameter r or the encoding parameter K obtained for a partial sequence of the inputted sequence of integer values. In a sixth embodiment, a mode will be described in which encoding and decoding of the present invention are implemented using at least one of the Rice parameter r and the encoding parameter K.

<<Encoding Apparatus>>

A processing procedure for the encoding method executed by an encoding apparatus 600 of the sixth embodiment will be described with reference to FIG. 11 and FIG. 12. As shown in FIG. 11, the encoding apparatus 600 of the sixth embodiment includes a parameter determination part 620 and an integer encoding part 610 as in the case of the encoding apparatus 400 and the encoding apparatus 500. The encoding method of the sixth embodiment is implemented by the encoding apparatus 600 of the sixth embodiment executing the processes in the respective steps shown in FIG. 12 as in the case of the encoding apparatus 400 and the encoding apparatus 500.

A sequence of non-negative integer values is inputted to the encoding apparatus 600 of the sixth embodiment as in the cases of the encoding apparatus 400 and the encoding apparatus 500. The sequence of non-negative integer values inputted to the encoding apparatus 600 of the sixth embodiment is inputted to the parameter determination part 620 and the integer encoding part 610 by N samples at a time.

In the following description, non-negative integer values inputted to the encoding apparatus of the present embodiment will be simply referred to as "integer values."

[Parameter Determination Part 620]

An integer sequence x_1, x_2, . . . , x_N of the sequence of integer values inputted to the encoding apparatus 600 by N samples at a time is inputted to the parameter determination part 620. Based on the inputted integer sequence x_1, x_2, . . . , x_N, the parameter determination part 620 obtains and outputs at least one of the Rice parameter r and the encoding parameter K, corresponding to the integer sequence, and a parameter code representing at least one of the Rice parameter r and the encoding parameter K (S620). That is, the parameter determination part 620 performs at least one of a process of obtaining a Rice parameter r according to equation (5) based on the integer values included in the integer sequence, and a process of obtaining an encoding parameter K according to equation (6) based on the integer values included in the integer sequence and performs a process of obtaining a parameter code by encoding at least one of the Rice parameter r and the encoding parameter K for each integer sequence which is a sequence of integer values for every predetermined number of samples included in the inputted sequence of non-negative integer values.

[Integer Encoding Part 610]

The integer sequence x_1, x_2, . . . , x_N of the sequence of integer values inputted to the encoding apparatus 600 by N samples at a time and at least one of the Rice parameter r and the encoding parameter K, outputted by the parameter determination part 620, are inputted to the integer encoding part 610. When the encoding parameter K is inputted, if the encoding parameter K is equal to or less than 1, the integer encoding part 610 performs Golomb-Rice encoding and outputs the code obtained by the Golomb-Rice encoding as an integer code as in the case of the fifth embodiment, and if the encoding parameter K is larger than 1, the integer encoding part 610 obtains and outputs an integer code through the same process as the process by any one of the integer encoding parts of the first to third embodiments as in the case of the fifth embodiment, and when the Rice parameter r is inputted, if the Rice parameter r is a non-negative value, the integer encoding part 610 performs Golomb-Rice encoding and outputs the code obtained through Golomb-Rice encoding as an integer code as in the case of the fourth embodiment and if the Rice parameter r is a negative value, the integer encoding part 610 obtains and outputs an integer code through the same process as the process of any one of the integer encoding parts of the first to third embodiments as in the case of the fourth embodiment (S610). That is, the integer encoding part 610 obtains codes such as code A and code B by using, for each integer sequence which is a sequence of integer values for every predetermined number of samples, the encoding parameter K obtained by the parameter determination part 620 or the encoding parameter K obtained from the Rice parameter r obtained by the parameter determination part 620 by applying K=2$^{-r}$ as the encoding parameter K. Especially when the encoding parameter K corresponding to the integer sequence is equal to or less than 1 or when the Rice parameter r corresponding to the integer sequence is a non-negative value, the integer sequence may be Golomb-Rice encoded to obtain a code string.

<<Decoding Apparatus>>

A processing procedure for the decoding method executed by the decoding apparatus 650 of the sixth embodiment will be described with reference to FIG. 13 and FIG. 14. As shown in FIG. 13, the decoding apparatus 650 of the sixth embodiment includes a parameter decoding part 670 and an integer decoding part 660 as in the cases of the decoding apparatus 450 and the decoding apparatus 550. The decoding method of the sixth embodiment is implemented by the decoding apparatus 650 of the sixth embodiment executing the processes in the respective steps shown in FIG. 14 as in the cases of the decoding apparatus 450 and the decoding apparatus 550.

An integer code outputted by the encoding apparatus 600 of the sixth embodiment and a parameter code are inputted to the decoding apparatus 650 of the sixth embodiment. The integer code and the parameter code inputted to the decoding apparatus 650 are inputted to the parameter decoding part 670 and the integer decoding part 660 for respective codes corresponding to N samples of the sequence of integer values. That is, parameter codes and code strings for each predetermined unit are inputted to the parameter decoding part 670 and the integer decoding part 660.

[Parameter Decoding Part 670]

The parameter decoding part 670 decodes a parameter code through the decoding process corresponding to the process whereby the parameter determination part 620 has obtained the parameter code, obtains and outputs at least one of the Rice parameter r and the encoding parameter K (S670). That is, the parameter decoding part 670 decodes the parameter code for each predetermined unit and obtains at least one of the Rice parameter r and the encoding parameter K.

[Integer Decoding Part 660]

The integer code inputted to the decoding apparatus 650 and at least one of the Rice parameter r and the encoding parameter K outputted by the parameter decoding part 670 are inputted to the integer decoding part 660. When the encoding parameter K is inputted, if the encoding parameter K is equal to or less than 1, the integer decoding part 660 performs Golomb-Rice decoding as in the case of the fifth embodiment, obtains and outputs an integer sequence x_1, x_2, . . . , x_N, and if the encoding parameter K is larger than 1, the integer decoding part 660 obtains and outputs the integer sequence x_1, x_2, . . . , x_N through the same process as the process of any one of the integer decoding parts of the first to third embodiments as in the case of the fifth embodiment, and when the Rice parameter r is inputted, if the Rice parameter r is a non-negative value, the integer decoding part 660 performs Golomb-Rice decoding as in the case of the fourth embodiment, obtains and outputs the integer sequence x_1, x_2, . . . , x_N, and if the Rice parameter r is a negative value, the integer decoding part 660 obtains and outputs the integer sequence x_1, x_2, . . . , x_N through the same process as the process of any one of the integer decoding parts of the first to third embodiments as in the case of the fourth embodiment (S660). That is, the integer decoding part 660 obtains, for each predetermined unit, a sequence of integer values consisting of a run of integer values 0 of length from 2 to $2^{K-1}$ and a set of a run of integer values 0 of length from 0 to $2^{K-1}-1$ and one non-zero integer value x_n using the encoding parameter K obtained by the parameter decoding part 670 or the encoding parameter K obtained from the Rice parameter r obtained by the parameter decoding part 670 by applying K=2$^{-r}$ as the encoding parameter K. Especially when the encoding parameter K is equal to or less than 1 or the Rice parameter r is a non-negative value, the code string may be Golomb-Rice decoded to obtain a sequence of integer values.

According to the invention of the present embodiment, if a value corresponding to a Rice parameter r corresponding to a sequence or a partial sequence of integer values is known, it is possible to perform encoding with a small average number of bits by using an encoding parameter K optimal to the sequence or decode such a code.

\<Supplements\>

Each device according to the present invention has, as a single hardware entity, for example, an input unit to which a keyboard or the like is connectable, an output unit to which a liquid crystal display or the like is connectable, a communication unit to which a communication device (for example, communication cable) capable of communication with the outside of the hardware entity is connectable, a central processing unit (CPU, which may include cache memory and/or registers), RANI or ROM as memories, an external storage device which is a hard disk, and a bus that connects the input unit, the output unit, the communication unit, the CPU, the RANI, the ROM, and the external storage device so that data can be exchanged between them. The hardware entity may also include, for example, a device (drive) capable of reading and writing a recording medium such as a CD-ROM as desired. A physical entity having such hardware resources may be a general-purpose computer, for example.

The external storage device of the hardware entity has stored therein programs necessary for embodying the aforementioned functions and data necessary in the processing of the programs (in addition to the external storage device, the programs may be prestored in ROM as a storage device exclusively for reading out, for example). Also, data or the like resulting from the processing of these programs are stored in the RAM and the external storage device as appropriate.

In the hardware entity, the programs and data necessary for processing of the programs stored in the external storage device (or ROM and the like) are read into memory as necessary to be interpreted and executed/processed as appropriate by the CPU. As a consequence, the CPU embodies predetermined functions (the components represented above as parts, units, means, or the like).

The present invention is not limited to the above embodiments, but modifications may be made within the scope of the present invention. Also, the processes described in the embodiments may be executed not only in a chronological sequence in accordance with the order of their description but may be executed in parallel or separately according to the processing capability of the device executing the processing or any necessity.

As already mentioned, when the processing functions of the hardware entities described in the embodiments (the devices of the present invention) are to be embodied with a computer, the processing details of the functions to be provided by the hardware entities are described by a program. By the program then being executed on the computer, the processing functions of the hardware entity are embodied on the computer.

The program describing the processing details can be recorded on a computer-readable recording medium. The computer-readable recording medium may be any kind, such as a magnetic recording device, an optical disk, a magneto-optical recording medium, or a semiconductor memory. More specifically, a magnetic recording device may be a hard disk device, flexible disk, or magnetic tape; an optical disk may be a DVD (digital versatile disc), a DVD-RAM (random access memory), a CD-ROM (compact disc read only memory), or a CD-R (recordable)/RW (rewritable); a magneto-optical recording medium may be an MO (magneto-optical disc); and a semiconductor memory may be EEP-ROM (electronically erasable and programmable-read only memory), for example.

Also, the distribution of this program is performed by, for example, selling, transferring, or lending a portable recording medium such as a DVD or a CD-ROM on which the program is recorded. Furthermore, a configuration may be adopted in which this program is distributed by storing the program in a storage device of a server computer and transferring the program to other computers from the server computer via a network.

The computer that executes such a program first, for example, temporarily stores the program recorded on the portable recording medium or the program transferred from the server computer in a storage device thereof. At the time of execution of processing, the computer then reads the program stored in the storage device thereof and executes the processing in accordance with the read program. Also, as another form of execution of this program, the computer may read the program directly from the portable recording medium and execute the processing in accordance with the program and, furthermore, every time the program is transferred to the computer from the server computer, the computer may sequentially execute the processing in accordance with the received program. Also, a configuration may be adopted in which the transfer of a program to the computer from the server computer is not performed and the above-described processing is executed by so-called application service provider (ASP)-type service by which the processing functions are implemented only by an instruction for execution thereof and result acquisition. Note that a program in this form shall encompass information that is used in processing by an electronic computer and acts like a program (such as data that is not a direct command to a computer but has properties prescribing computer processing).

Further, although the hardware entity was described as being configured via execution of a predetermined program on a computer in this form, at least some of these processing details may instead be embodied with hardware.

The foregoing description of the embodiments of the invention has been presented for the purpose of illustration and description. It is not intended to be exhaustive and to limit the invention to the precise form disclosed. Modifications or variations are possible in light of the above teaching. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An encoding apparatus comprising an integer encoding part that obtains, for an inputted sequence of non-negative integer values $x\_n$, $n \in \{1, 2, \ldots, N\}$ (hereinafter referred to as an "integer sequence"), a 1-bit code (hereinafter referred to as a "code A") as a code corresponding to a run of integer values 0 of length L, a predetermined number which satisfies $2 \leq L \leq 2^{K-1}$, which is included in the integer sequence, and obtains a ($K \times x\_n$)-bit or ($K \times x\_n+1$)-bit code (hereinafter referred to as a "code B") as a code corresponding to a set of a run of integer values 0 of length from 0 to L−1 and one non-zero integer value $x\_n$ included in the integer sequence, where K is assumed to be an integer equal to or larger than 2.

2. The encoding apparatus according to claim 1, wherein assuming that a bit value "x" is a bit value "1" and a bit value "y" is a bit value "0," or a bit value "x" is a bit value "0" and a bit value "y" is a bit value "1,"

the code A is a 1-bit code, a bit value of which is "x," and
the code B includes at least 1 bit value "x" and at least 1 bit value "y" in a first bit to a K-th bit and bit values of K×(x_n−1) bits from the last are "y."

3. The encoding apparatus according to claim 2, wherein L is $2^{K-1}$, and
each of $2^{K-1}$ runs of integer values 0 of length from 0 to $2^{K-1}-1$ in the integer sequence forms a one-to-one correspondence with any one of $2^{K-1}$ partial codes comprising:
one partial code comprising (K+1) bits from a first bit to a (K+1)-th bit of the code B, a bit value of the first bit of which is "x" and bit values of a second bit to the (K+1)-th bit of which are "y," when the code B has (K×x_n+1) bits; and
($2^{K-1}-1$) partial codes comprising K bits from the first bit to the K-th bit of the code B, a bit value of the first bit of which is "y" and a bit value of at least 1 bit of (K−1) bits from the second bit to the K-th bit of which is "x," when the code B has (K×x_n) bits.

4. The encoding apparatus according to any one of claims 1 to 3, wherein
the integer sequence is a sequence of N integer values included in an inputted sequence of non-negative integer values,
the encoding apparatus further comprises a parameter determination part that performs, for each of the integer sequences, at least one of:
a process of obtaining a Rice parameter r based on the integer values included in the integer sequence according to the following equation:

[Formula 7]

$$r = \log_2\left(\frac{\ln 2}{N}\sum_{n=1}^{N} x\_n\right)$$

and
a process of obtaining an encoding parameter K based on the integer values included in the integer sequence according to the following equation:

[Formula 8]

$$K = \log_2\left(1 + \frac{1}{\frac{1}{N}\sum_{n=1}^{N} x\_n}\right);$$

and
a process of obtaining a parameter code by encoding at least one of the Rice parameter r and the encoding parameter K, and
the integer encoding part uses, for each of the integer sequences, the encoding parameter K obtained by the parameter determination part or the encoding parameter K obtained from the Rice parameter r obtained by the parameter determination part by applying $K=2^{-r}$, as the K.

5. The encoding apparatus according to claim 4, wherein when the encoding parameter K corresponding to the integer sequence is equal to or less than 1 or when the Rice parameter r corresponding to the integer sequence is a non-negative value, the integer encoding part obtains a code string by Golomb-Rice encoding the integer sequence.

6. A decoding apparatus comprising an integer decoding part that obtains a sequence of integer value x_n, n∈{1, 2, ..., N} by
obtaining, for an inputted code string, a run of integer values 0 of length L, a predetermined number which satisfies $2≤L≤2^{K-1}$, from a 1-bit code (hereinafter referred to as a "code A") included in the inputted code string, and
obtaining a set of a run of integer values 0 of length from 0 to L−1 and one non-zero integer value x_n from a (K×x_n)-bit or (K×x_n+1)-bit code (hereinafter referred to as a "code B") included in the inputted code string, where K is assumed to be an integer equal to or larger than 2.

7. The decoding apparatus according to claim 6, wherein assuming that a bit value "x" is a bit value "1" and a bit value "y" is a bit value "0," or a bit value "x" is a bit value "0" and a bit value "y" is a bit value "1,"
the code A is a 1-bit code, a bit value of which is "x," and
the code B includes at least 1 bit value "x" and at least 1 bit value "y" in a first bit to a K-th bit and bit values of K×(x_n−1) bits from the last are "y."

8. The decoding apparatus according to claim 6 or 7, wherein
the integer decoding part identifies the code A and the code B included in the inputted code string by:
reading in order from the beginning of the inputted code string, the inputted code string by a run of K bits (hereinafter referred to as a "K-bit string") at a time; and
identifying, when the read K-bit string includes "y," that a bit immediately before the K-bit string including the "y" is a termination bit of the code A or the code B.

9. The decoding apparatus according to claim 7, wherein L is $2^{K-1}$, and
each of $2^{K-1}$ partial codes comprising:
one partial code comprising (K+1) bits from a first bit to a (K+1)-th bit of the code B, a bit value of the first bit of which is "x" and bit values of a second bit to the (K+1)-th bit of which are "y," when the code B has (K×x_n+1) bits; and
($2^{K-1}-1$) partial codes comprising K bits from the first bit to a K-th bit of the code B, a bit value of the first bit of which is "y" and a bit value of at least 1 bit of (K−1) bits from the second bit to the K-th bit of which is "x," when the code B has (K×x_n) bits,
forms a one-to-one correspondence with any one of $2^{K-1}$ runs of integer values 0 of length from 0 to $2^{K-1}-1$ in the sequence of integer value obtained by the integer decoding part.

10. The decoding apparatus according to any one of claims 6, 7, or 9, further comprising a parameter decoding part that receives a parameter code for each predetermined unit and the code string as input, and
obtains at least one of a Rice parameter r and an encoding parameter K by decoding the parameter code for each predetermined unit, and
the integer decoding part uses the encoding parameter K obtained by the parameter decoding part or the encoding parameter K obtained from the Rice parameter r obtained by the parameter decoding part by applying $K=2^{-r}$, as the K for each predetermined unit.

11. The decoding apparatus according to claim 10, wherein when the encoding parameter K is equal to or less than 1 or when the Rice parameter r is a non-negative value, the integer decoding part obtains a sequence of integer values by Golomb-Rice decoding the code string.

12. A data structure of a code string representing a sequence of non-negative integer values x_n, n∈{1, 2, ..., N} (hereinafter referred to as an "integer sequence"), the code string being used for an encoding apparatus that obtains the code string from the integer sequence or/and a decoding apparatus that obtains the integer sequence from the code string, the data structure comprising:

a 1-bit code (hereinafter referred to as a "code A") which is a code corresponding to a run of integer values 0 of length L, a predetermined number which satisfies $2 \leq L \leq_2 K-1$, which is included in the integer sequence; and a (K×x_n)-bit or (K×x_n+1)-bit code (hereinafter referred to as a "code B") which is a code corresponding to a set of a run of integer values 0 of length from 0 to L−1 and one non-zero integer value x_n included in the integer sequence, where K is assumed to be an integer equal to or larger than 2.

13. The data structure of a code string according to claim 12, wherein assuming that a bit value "x" is a bit value "1" and a bit value "y" is a bit value "0," or a bit value "x" is a bit value "0" and a bit value "y" is a bit value "1,"

the code A is a 1-bit code, a bit value of which is "x," and the code B includes at least 1 bit value "x" and at least 1 bit value "y" in a first bit to a K-th bit and bit values of K×(x_n−1) bits from the last are "y."

14. The data structure of a code string according to claim 13, wherein

L is $2^{K-1}$, and each of $2^{K-1}$ runs of integer values 0 of length from 0 to $2^{K-1}-1$ in the integer sequence forms a one-to-one correspondence with any one of $2^{K-1}$ partial codes comprising:

one partial code comprising (K+1) bits from a first bit to a (K+1)-th bit of the code B, a bit value of the first bit of which is "x" and bit values of a second bit to the (K+1)-th bit of which are "y," when the code B has (K×x_n+1) bits; and $(2^{K-1}-1)$ partial codes comprising K bits from the first bit to the K-th bit of the code B, a bit value of the first bit of which is "y" and a bit value of at least 1 bit of (K−1) bits from the second bit to the K-th bit of which is "x," when the code B has (K×x_n) bits.

15. An encoding method for executing:

an integer encoding step in which an encoding apparatus obtains, for an inputted sequence of non-negative integer values x_n, n∈{1, 2, ..., N} (hereinafter referred to as an "integer sequence"), a 1-bit code (hereinafter referred to as a "code A") as a code corresponding to a run of integer values 0 of length L, a predetermined number which satisfies $2 \leq L \leq 2^{K-1}$, which is included in the integer sequence, and obtains a (K×x_n)-bit or (K×x_n+1)-bit code (hereinafter referred to as a "code B") as a code corresponding to a set of a run of integer values 0 of length from 0 to L−1 and one non-zero integer value x_n included in the integer sequence, where K is assumed to be an integer equal to or larger than 2.

16. A decoding method for executing:

an integer decoding step in which a decoding apparatus obtains a sequence of integer value x_n, n∈{1, 2, ..., N} by obtaining, for an inputted code string, a run of integer values 0 of length L, a predetermined number which satisfies $2 \leq L \leq 2^{K-1}$, from a 1-bit code (hereinafter referred to as a "code A") included in the inputted code string, and obtaining a set of a run of integer values 0 of length from 0 to L−1 and one non-zero integer value x_n from a (K×x_n)-bit or (K×x_n+1)-bit code (hereinafter referred to as a "code B") included in the inputted code string, where K is assumed to be an integer equal to or larger than 2.

17. A non-transitory computer-readable storage medium which stores an encoding program for causing a computer to function as the encoding apparatus according to any one of claims 1 to 3.

18. A non-transitory computer-readable storage medium which stores a decoding program for causing a computer to function as the decoding apparatus according to any one of claim 6, 7, or 9.

* * * * *